United States Patent
Dai et al.

(10) Patent No.: US 12,167,609 B2
(45) Date of Patent: Dec. 10, 2024

(54) SEMICONDUCTOR STRUCTURE AND METHOD OF FORMING THE SAME

(71) Applicant: TAIWAN SEMICONDUCTOR MANUFACTURING COMPANY LTD., Hsinchu (TW)

(72) Inventors: Min-Kun Dai, Hsinchu (TW); Yen-Chieh Huang, Changhua County (TW); Kuo-Chang Chiang, Hsinchu (TW); Han-Ting Tsai, Kaoshiung (TW); Tsann Lin, Hsinchu (TW); Chung-Te Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 387 days.

(21) Appl. No.: 17/589,634

(22) Filed: Jan. 31, 2022

(65) Prior Publication Data
US 2023/0036606 A1    Feb. 2, 2023

Related U.S. Application Data

(60) Provisional application No. 63/227,763, filed on Jul. 30, 2021.

(51) Int. Cl.
*H10B 51/30* (2023.01)
*H01L 21/28* (2006.01)
(Continued)

(52) U.S. Cl.
CPC ........ *H10B 51/30* (2023.02); *H01L 29/40111* (2019.08); *H01L 29/66969* (2013.01); *H01L 29/78391* (2014.09); *H01L 29/7869* (2013.01)

(58) Field of Classification Search
CPC .............. H10B 51/30; H01L 29/40111; H01L 29/66969; H01L 29/78391; H01L 29/7869; H01L 29/41733
See application file for complete search history.

(56) References Cited

U.S. PATENT DOCUMENTS

| | | | |
|---|---|---|---|
| 2007/0126042 A1* | 6/2007 | Kijima | H01L 29/78391 257/295 |
| 2019/0074303 A1 | 3/2019 | Kim et al. | |
| 2022/0157833 A1* | 5/2022 | Kobayashi | H01L 29/78391 |

FOREIGN PATENT DOCUMENTS

| | | |
|---|---|---|
| CN | 104617099 A | 5/2015 |
| CN | 112054034 A | 12/2020 |

(Continued)

OTHER PUBLICATIONS

Pardo et al. ("Low temperature preparation of piezoelectric thin films by ultraviolet-assisted rapid thermal processing," Materials Science in Semiconductor Processing, 5, pp. 77-83, 2003) (Year: 2003).*

(Continued)

*Primary Examiner* — Yasser A Abdelaziz
(74) *Attorney, Agent, or Firm* — WPAT LAW; Anthony King

(57) ABSTRACT

A method of forming a semiconductor structure includes following operations. A memory layer is formed over the first gate electrode. A channel layer is formed over the memory layer. A first SUT treatment is performed. A second dielectric layer is formed over the memory layer and the channel layer. A source electrode and a drain electrode are formed in the second dielectric layer. A temperature of the first SUT treatment is less than approximately 400° C.

20 Claims, 35 Drawing Sheets

(51) Int. Cl.
  *H01L 29/66* (2006.01)
  *H01L 29/78* (2006.01)
  *H01L 29/786* (2006.01)

(56) References Cited

FOREIGN PATENT DOCUMENTS

| TW | 202107464 A | 2/2021 |
|---|---|---|
| TW | 202109633 A | 3/2021 |
| WO | 2018021709 A1 | 2/2018 |

OTHER PUBLICATIONS

Joh, Hyunjin, et al. "Low-Temperature Growth of Ferroelectric Hf0. 5Zr0. 5O2 Thin Films Assisted by Deep Ultraviolet Light Irradiation." ACS Applied Electronic Materials 3.3 (2021): 1244-1251.
U.S. Pat. No. 11,594,633B2 is the US counterpart of TW 202109633 A.
US 2022/0157833 A1 is the US counterpart of TW 202107464 A.
English Abstract of CN 104617099 A.
English Abstract of CN 112054034 A.
English Abstract of WO2018021709A1.

\* cited by examiner

SEMICONDUCTOR STRUCTURE AND METHOD OF FORMING THE SAME

PRIORITY DATA

This patent claims the benefit of U.S. Provisional Patent Application Ser. No. 63/227,763 filed Jul. 30, 2021, the entire disclosure of which is hereby incorporated by reference.

BACKGROUND

With advantages of non-volatility, low power consumption, short programming time, and high read/write endurance, ferroelectric random-access memory (FeRAM) has drawn increasing attention in the semiconductor industry.

FeRAM can be categorized into two types. One type is made of transistors connected with capacitors, such as IT IC or chain FeRAM structures. The other type is a field-effect transistor (FET), and is referred to as a ferroelectric memory field-effect transistor (FeMFET). The structure of the FeMFET is similar to that of the metal-oxide-semiconductor field-effect transistor (MOSFET), but the FeMFET uses a ferroelectric material as part of its gate dielectric.

One type of FeMFET has a metal-ferroelectric-semiconductor field-effect transistor (MFS-FET) structure in which the gate dielectric is formed using a ferroelectric layer rather than oxide. However, it has been found that MFS structures suffer from interface reactions between ferroelectric materials and semiconductor substrates, high leakage current, retention and fatigue. Another type of FeMFET has a metal-ferroelectric-insulator-silicon-FET (MFIS-FET) structure with an insulating layer separating the ferroelectric layer from the semiconductor substrate. A third type of FeMFET is a metal-ferroelectric-metal-insulator-semiconductor-FET (MFMIS FET) structure.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
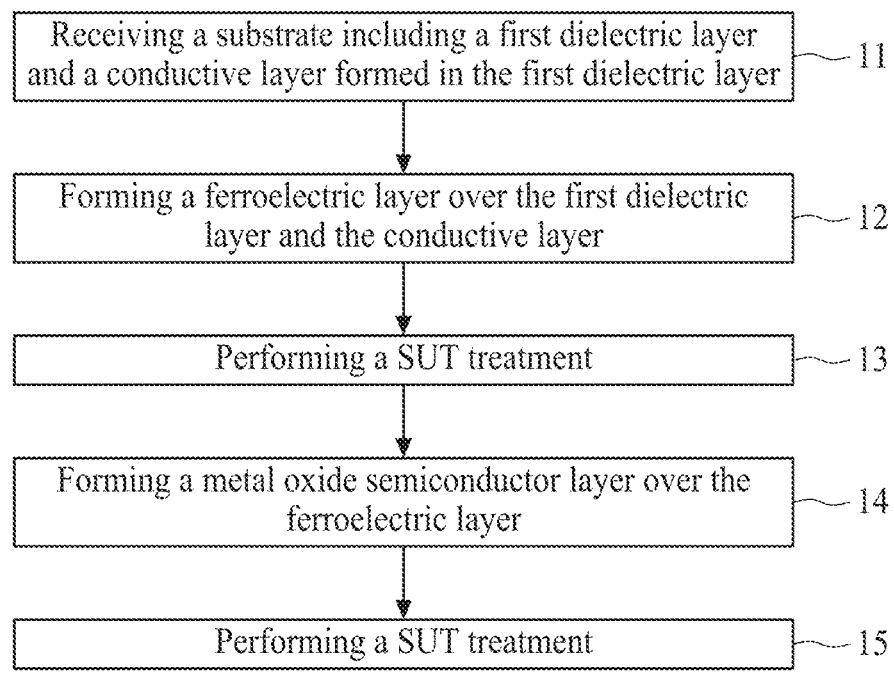
FIG. 1 is a flow diagram of some embodiments of a method of forming a semiconductor structure according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature on or over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of brevity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, portions, layers and/or sections, but these elements, components, portions, layers and/or sections should not be limited by these terms. These terms may be only used to distinguish one element, component, portion, layer or section from another.

The terms such as "first," "second" and "third" when used herein do not imply a sequence or order unless clearly indicated by the context.

Because a FeMFET uses a ferroelectric material as part of its gate dielectric and a metal oxide semiconductor layer as part of a channel layer, a crystalline quality is essential to the ferroelectric material and the metal oxide semiconductor material. In some comparative approaches, a weak crystallization, which may increase densities of grain-boundary-related defects and oxygen vacancies, may sabotage the quality of an as-dep ferroelectric layer. For an as-dep metal oxide semiconductor layer, a density of oxygen-related defects, such as oxygen vacancies and oxygen interstitials, and weak metal-oxide bonding, may cause electron tapping and thermal instability. Ultimately, electrical characteristics and stability of the FeMFET are adversely impacted by film qualities of the ferroelectric material and the metal oxide semiconductor material.

In some comparative approaches, the above-mentioned crystalline issue and oxygen-related defects may be resolved using a thermal treatment with a temperature greater than 450° C. However, such temperature exceeds a thermal budget of a back-end-of-line (BEOL) process, and may cause damage to a metallization layer in a BEOL interconnect structure.

Difficulties caused by a trade-off between the film qualities of the ferroelectric material and the metal oxide semiconductor material and the thermal budget of the BEOL interconnect structure may be mitigated by a method provided by the present disclosure. In some embodiments, the method uses a simultaneous ultraviolet and thermal (SUT) treatment performed on the ferroelectric material and the metal oxide semiconductor material. UV irradiation activates oxygen atoms in the ferroelectric material and the metal oxide semiconductor material. The generation of reactive oxygen could facilitate densification of the metal oxide semiconductor material initiated in a nucleation process. The simultaneous thermal process improves orthorhombic (O) phase fraction in the ferroelectric material. The simultaneous thermal process also reorganizes and strengthens the M-O bonding of the ferroelectric material and the metal oxide semiconductor material. Accordingly, the SUT treatment may improve the film qualities of the ferroelectric material and the metal oxide semiconductor material at a temperature less than approximately 400° C., which is lower than the thermal budget of the BEOL interconnect structure.

FIG. 1 is a flow diagram of some embodiments of a method of forming a semiconductor structure 10, and FIGS. 2A to 2D are schematic drawings illustrating the method of forming the semiconductor structure 10 at various fabrication stages according to aspects of the present disclosure in one or more embodiments. The method 10 includes a number of operations (11, 12, 13, 14 and 15). The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may be only briefly described herein. Thus, other implementations are possible within the scope of the various aspects described herein.

Figure 2A:
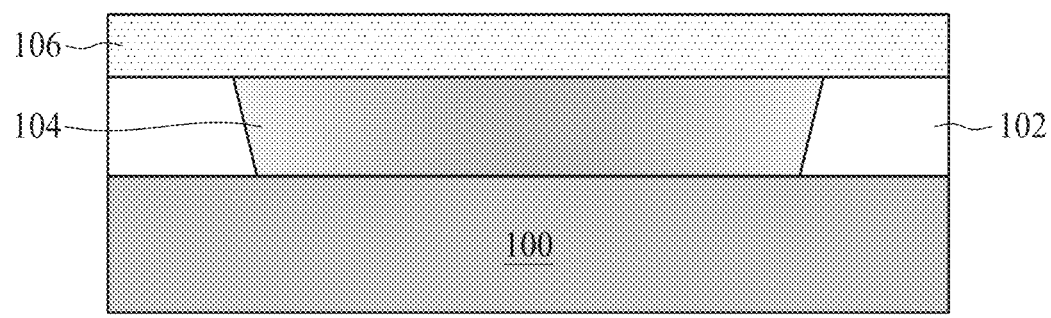
FIGS. 2A to 2D are schematic drawings illustrating the method of forming the semiconductor structure at various fabrication stages according to aspects of the present disclosure in one or more embodiments.

FIGS. 2A to 2D are schematic drawings illustrating the method of forming the semiconductor structure at various fabrication stages according to aspects of the present disclosure in one or more embodiments. Referring to FIG. 2A, in operation 11, a substrate 100 is received. In some embodiments, the substrate 100 is a semiconductor substrate. In some embodiments, the substrate 100 includes a silicon (Si) substrate. In other embodiments, the substrate 100 may include another elementary semiconductor, such as germanium (Ge); a compound semiconductor including silicon carbide (SiC), gallium arsenide (GaAs), gallium phosphide (GaP), indium phosphide (InP), indium arsenide (InAs), or indium antimonide (InSb); an alloy semiconductor including silicon germanium (SiGe), gallium arsenide phosphide (GaAsP), aluminum indium phosphide (AlInP), aluminum gallium arsenide (AlGaAs), gallium indium arsenide (GaInAs), gallium indium phosphide (GaInP), or gallium indium arsenide phosphide (GaInAsP); or a combination thereof.

As shown in FIG. 2A, a dielectric layer 102 is formed on the substrate 100, and a conductive later 104 is formed in the dielectric layer 102. In some embodiments, the dielectric layer 102 and the conductive layer 104 may be part of a BEOL interconnect structure. The dielectric layer 102 may be an inter-metal dielectric (IMD) of the BEOL interconnect structure. A top surface of the conductive layer 104 and a top surface of the dielectric layer 102 may aligned with each other. In some embodiments, the conductive layer 104 may include metal and metal nitride. For example, the conductive layer 104 may include platinum (Pt), titanium (Ti), titanium nitride (TiN), tantalum (Ta), tantalum nitride (TaN), tungsten (W), iron (Fe), nickel (Ni), beryllium (Be), chromium (Cr), cobalt (Co), antimony (Sb), iridium (Ir), molybdenum (Mo), osmium (Os), thorium (Th), vanadium (V), or a combination thereof.

Still referring to FIG. 2A, in operation 12, a ferroelectric layer 106 is formed over the conductive layer 104 and the dielectric layer 102. In some embodiments, a thickness of the ferroelectric layer 106 may be between approximately 0.1 nanometer and approximately 100 nanometers. In some embodiments, the ferroelectric layer 106 includes hafnium zirconium oxide ($Hf_xZr_{1-x}O_y$), wherein x of $Hf_xZr_{1-x}O_y$ can be varied from 0 to 1. For example, the ferroelectric layer 106 may include $Hf_{0.5}Zr_{0.5}O_2$. In some embodiments, the ferroelectric layer 106 may have oxygen vacancies.

Figure 2B:
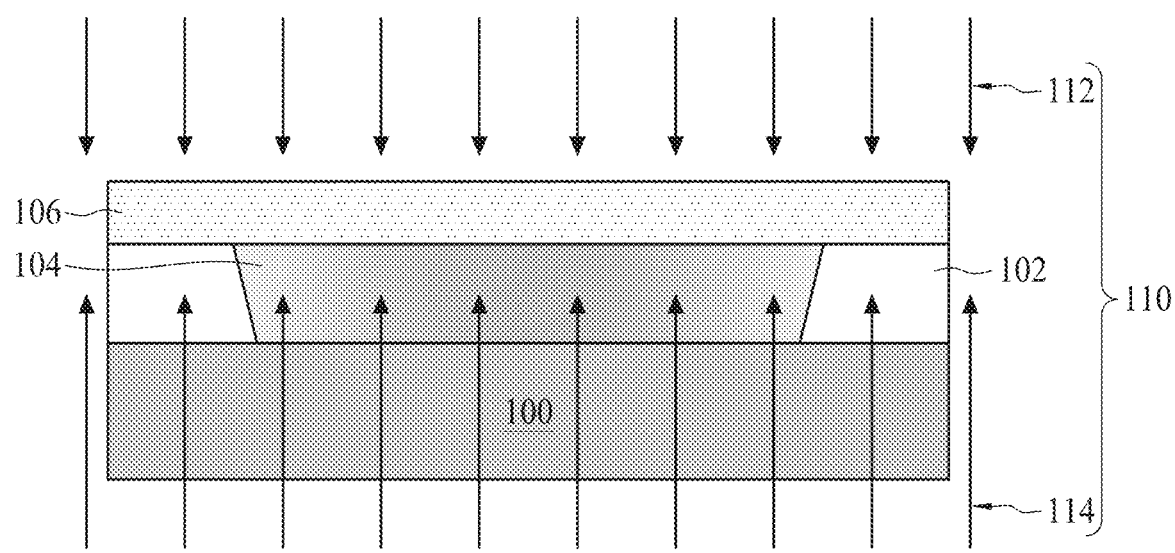

Referring to FIG. 2B, in operation 13, an SUT treatment 110 is performed on the ferroelectric layer 106. The SUT treatment 110 includes a UV radiation 112 and an anneal 114. In some embodiments, the UV radiation 112 has a wavelength between approximately 10 nanometers and approximately 400 nanometers, but the disclosure is not limited thereto. In some embodiments, the UV radiation 112 is performed on a surface of the ferroelectric layer 106, as shown in FIG. 2B. In some embodiments, the anneal 114 is performed using a furnace or a hot plate, and the substrate 100 is disposed thereon, so that heat is transferred in a direction from the substrate 100 to the ferroelectric layer 106. In other words, an incident direction of the UV radiation 112 and a heat transferring direction of the anneal 114 are opposite to each other. In some embodiments, oxygen may be introduced during the SUT treatment 110. The introduced oxygen may help further mitigate the oxygen vacancy issue.

In some embodiments, a temperature of the SUT treatment 110 is less than approximately 400° C. For example, the temperature of the SUT treatment 110 is between approximately 100° C. and approximately 400° C. In some embodiments, a duration of the SUT treatment 110 is less than approximately 1 hour. During the SUT treatment 110, a weaker bonding is decomposed by the UV radiation 112, and thus the ferroelectric layer 106 is re-crystallized to have an orthorhombic crystal phase by the anneal 114. Further, oxygen vacancies are reduced during the SUT treatment 110.

Accordingly, film quality of the ferroelectric layer 106 is improved. It should be noted that because the UV radiation 112 helps to decompose the weaker bonding, the temperature and the duration of anneal 114 used for re-crystallization and the mitigation of the oxygen vacancy are both reduced.

Figure 2C:
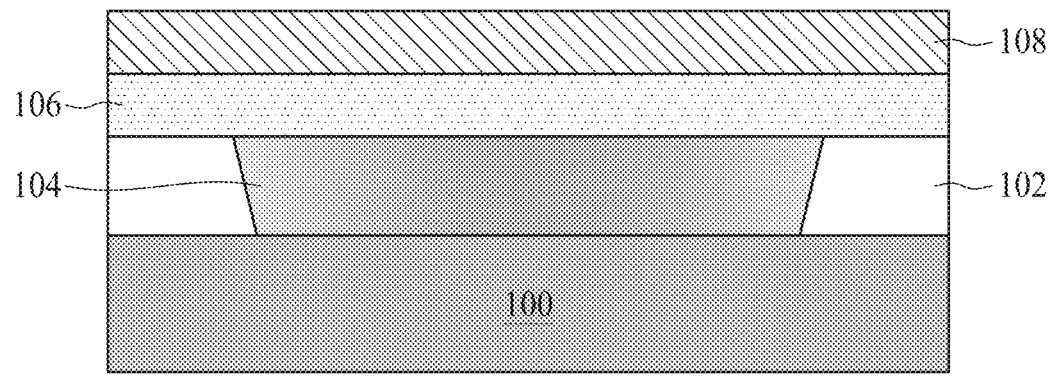

Referring to FIG. 2C, in operation 14, a metal oxide semiconductor layer 108 is formed over the ferroelectric layer 106. In some embodiments, a thickness of the metal oxide semiconductor layer 108 is between approximately 0.1 nanometer and approximately 100 nanometers, but the disclosure is not limited thereto. In some embodiments, the metal oxide semiconductor layer 108 may include silicon, silicon germanium, III-V semiconductor material (e.g., GaAs, GaAsIn) and/or II-VI semiconductor material (e.g., ZnO, MgO, GdO), but the disclosure is not limited thereto.

Figure 2D:
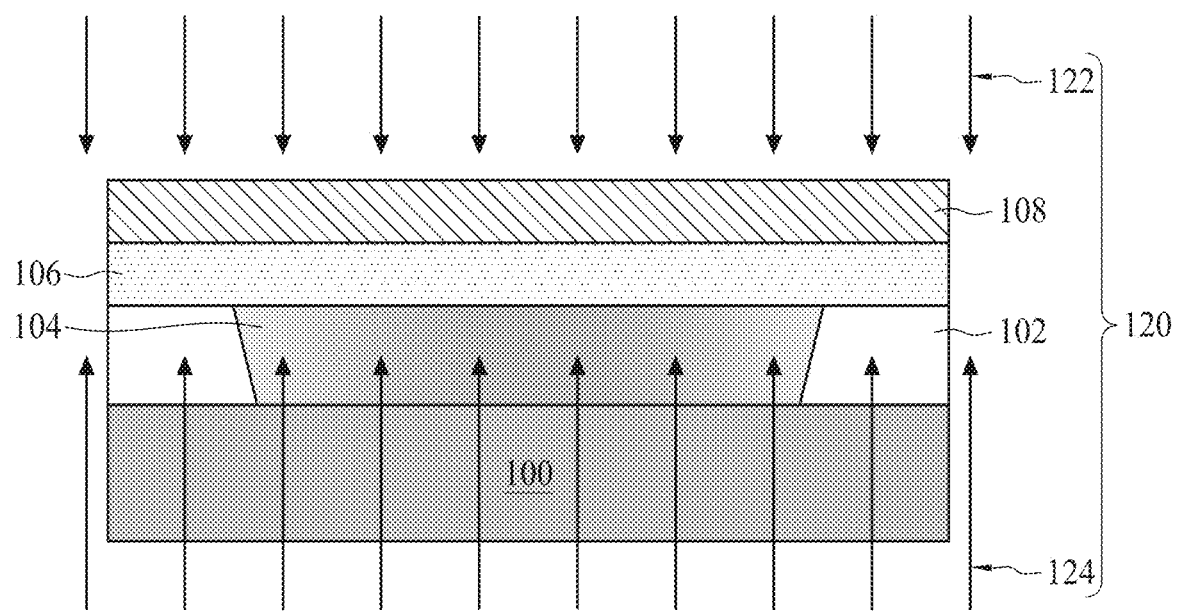

Referring to FIG. 2D, in some embodiments, in operation 15, a SUT treatment 120 is performed on the metal oxide semiconductor layer 108. The SUT treatment 120 includes an UV radiation 122 and an anneal 124. In some embodiments, the UV radiation 122 has a wavelength between approximately 10 nanometers and approximately 400 nanometers, but the disclosure is not limited thereto. In some embodiments, the UV radiation 122 is performed on a surface of the metal oxide semiconductor layer 108, as shown in FIG. 2D. In some embodiments, the anneal 124 is performed using a furnace or a hot plate where the substrate 100 is disposed thereon. Therefore heat is transferred in a direction from the substrate 100 to the metal oxide semiconductor layer 108. In other words, an incident direction of the UV radiation 122 and a heat transferring direction of the anneal 124 are opposite to each other. In some embodiments, oxygen may be introduced during the SUT treatment 120. The introduced oxygen may help further cure the oxygen vacancy defect.

In some embodiments, a temperature of the SUT treatment 120 is less than approximately 400° C. For example, the temperature of the SUT treatment 120 is between approximately 100° C. and approximately 400° C. In some embodiments, a duration of the SUT treatment 120 is less than approximately 1 hour. During the SUT treatment 120, a weaker M-O bonding of the metal oxide semiconductor layer 108 is decomposed by the UV radiation 122, and thus is re-organized and strengthened into a strong M-O bonding by the anneal 124. Further, more O radicals may be generated by the UV radiation 122 to mitigate the oxygen vacancies. Accordingly, a film quality of the metal oxide semiconductor layer 108 is improved. It should be noted that because of the UV radiation 122, lower temperature and less duration of the anneal 124 are required for the re-bonding and the mitigation of the oxygen vacancy.

According to the method 10, the film qualities of the ferroelectric layer 106 and the metal oxide semiconductor layer 108 are both improved by the SUT treatments 110 and 120. In contrast with comparative approaches, the temperature and duration of the SUT treatments 110 and 120 are reduced, and thus the method 10 is more suitable in BEOL interconnect fabrication.

Figure 3:
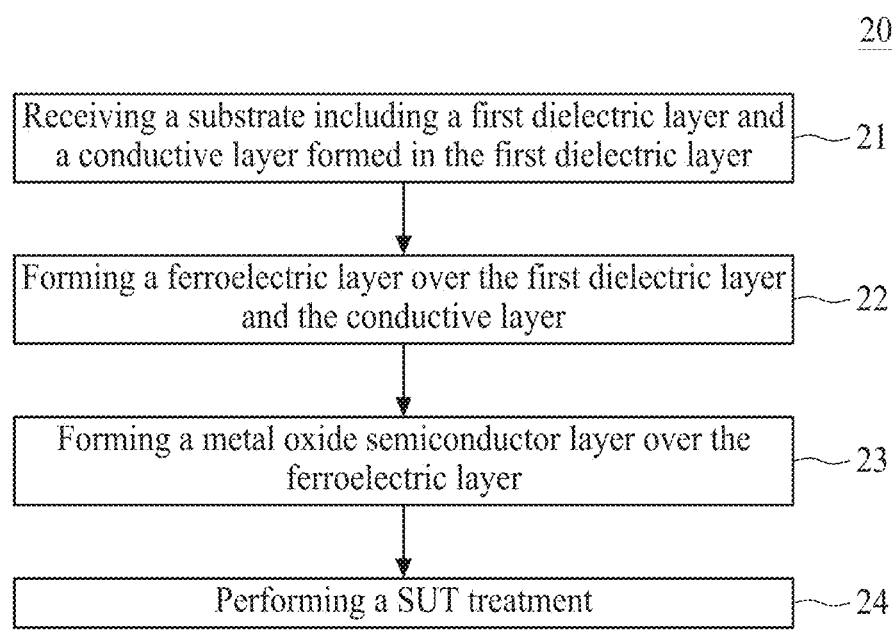
FIG. 3 is a flow diagram of some embodiments of a method of forming a semiconductor structure according to aspects of the present disclosure in one or more embodiments.
Figure 4A:
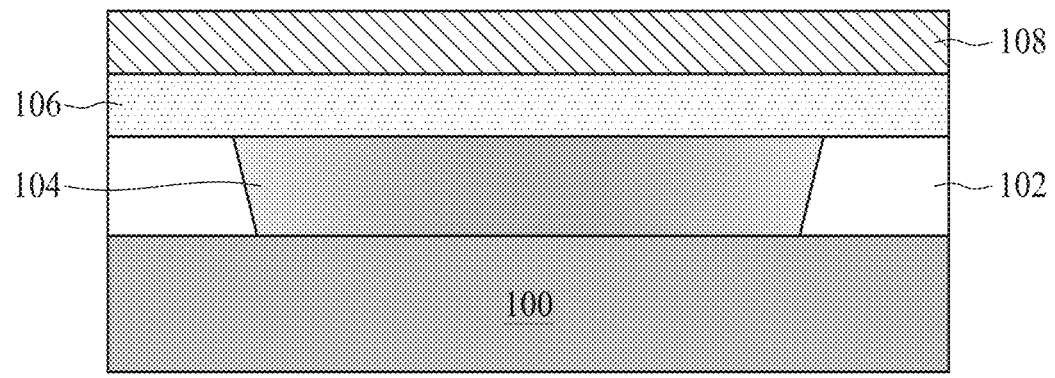
FIGS. 4A and 4B are schematic drawings illustrating the method of forming the semiconductor structure at various fabrication stages according to aspects of the present disclosure in one or more embodiments.
Figure 4B:
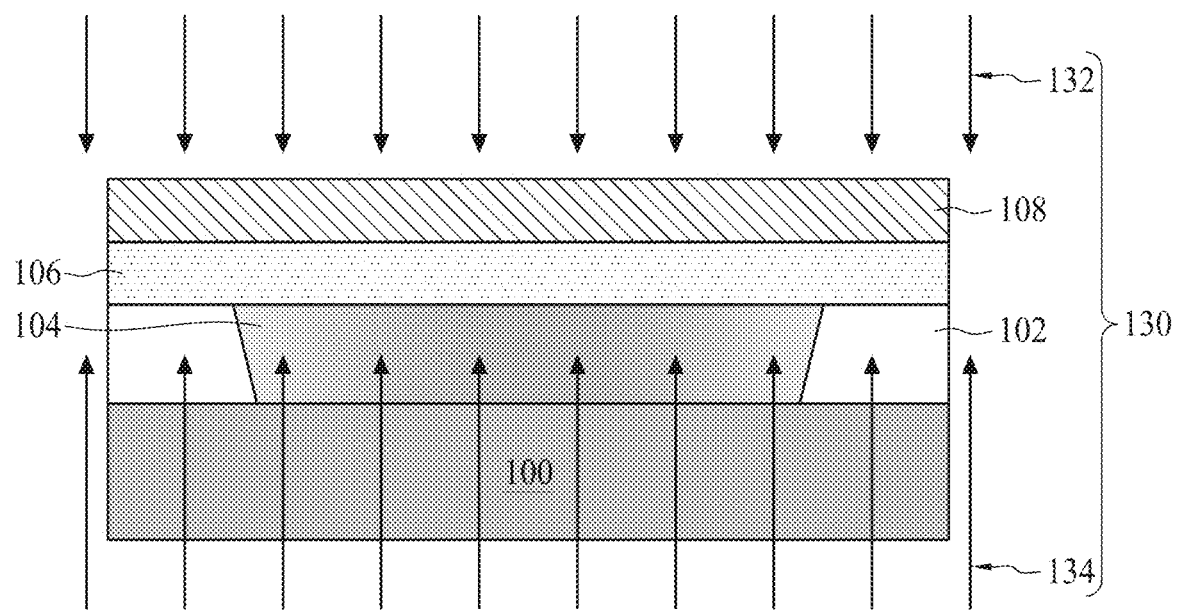

FIG. 3 is a flow diagram of some embodiments of a method of forming a semiconductor structure 20, and FIGS. 4A and 4B are schematic drawings illustrating the method of forming the semiconductor structure at various fabrication stages according to aspects of the present disclosure in one or more embodiments. Further, similar elements in FIGS. 2A to 2D and FIGS. 4A and 4B can include similar materials, and thus repeated descriptions of such details are omitted in the interest of brevity. The method 20 includes a number of operations (21, 22, 23 and 24). The method 20 will be further described according to one or more embodiments. It should be noted that the operations of the method 20 may be rearranged or otherwise modified within the scope of the various aspects. It should be further noted that additional processes may be provided before, during, and after the method 20, and that some other processes may be only briefly described herein. Thus, other implementations are possible within the scope of the various aspects described herein.

Referring to FIG. 4A, in operation 21, a substrate 100 is received. In some embodiments, the substrate 100 is a semiconductor substrate. In some embodiments, a dielectric layer 102 is formed on the substrate 100, and a conductive layer 104 is formed in the dielectric layer 102. As mentioned above, the dielectric layer 102 and the conductive layer 104 may be part of a BEOL interconnect structure.

Still referring to FIG. 4A, in operation 22, a ferroelectric layer 106 is formed over the conductive layer 104 and the dielectric layer 102. In operation 23, a metal oxide semiconductor layer 108 is formed over the ferroelectric layer 106.

Referring to FIG. 4B, in operation 24, an SUT treatment 130 is performed on the ferroelectric layer 106 and the metal oxide semiconductor layer 108. In some embodiments, a temperature of the SUT treatment 130 is less than approximately 400° C. For example, the temperature of the SUT treatment 130 is between approximately 100° C. and approximately 400° C. In some embodiments, a duration of the SUT treatment 130 is less than approximately 1 hour. In some embodiments, the SUT treatment 130 may include a UV radiation 132 and an anneal 134. The UV radiation 132 is performed on a surface of the metal oxide semiconductor layer 108, but the UV radiation 132 may penetrate the metal oxide semiconductor layer 108 and have effect on both of the metal oxide semiconductor layer 108 and the ferroelectric layer 106, as shown in FIG. 4B. In some embodiments, the anneal 134 is performed using a furnace or a hot plate, and the substrate 100 is disposed thereon, so that heat is transferred in a direction from the substrate 100 to the ferroelectric layer 106 and the metal oxide semiconductor layer 108. In other words, an incident direction of the UV radiation 132 and a heat transferring direction of the anneal 134 are opposite to each other. In some embodiments, oxygen may be introduced during the SUT treatment 130. The introduced oxygen may help further mitigate the oxygen vacancy issue.

During the SUT treatment 130, a weaker bonding is decomposed by the UV radiation 132, and thus the ferroelectric layer 106 is re-crystalized by the anneal 134 to have an orthorhombic crystal phase. For the metal oxide semiconductor layer 108, a weaker M-O bonding of the metal oxide semiconductor layer 108 is decomposed by the UV radiation 132, and thus is re-organized and strengthened into a strong M-O bonding by the anneal 134.

As mentioned above, oxygen vacancies are reduced during the SUT treatment 130. Accordingly, a film quality of the ferroelectric layer 106 is improved. For the metal oxide semiconductor layer 108, more O radicals may be generated by the UV radiation 132 to mitigate the oxygen vacancy. Accordingly, a film quality of the metal oxide semiconductor layer 108 is also improved. It should be noted that because the UV radiation 132 helps to decompose the weaker bonding, lower temperature and less duration of the anneal 134 are required for re-crystallization, re-bonding and the mitigation of the oxygen vacancy.

Figure 5A:
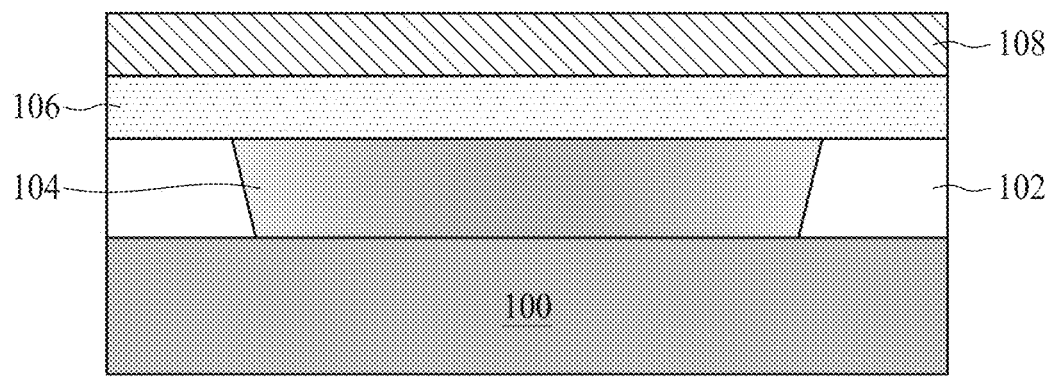
FIGS. 5A to 5D are schematic drawings illustrating the method of forming the semiconductor structure at various fabrication stages according to aspects of the present disclosure in one or more embodiments.

Please refer to FIGS. 5A to 5D, which are schematic drawings illustrating the method of forming the semiconductor structure at various fabrication stages according to aspects of the present disclosure in one or more embodiments. Further, similar elements in FIGS. 2A to 2D and FIGS. 5A to 5B can include similar materials, and thus repeated descriptions of such details are omitted in the interest of brevity. Referring to FIG. 5A, in operation 21, a substrate 100 is received. In some embodiments, a dielectric layer 102 is formed on the substrate 100, and a conductive layer 104 is formed in the dielectric layer 102. As mentioned above, the dielectric layer 102 and the conductive layer 104 may be part of a BEOL interconnect structure. The dielectric layer 102 may be an inter-metal dielectric (IMD) of the BEOL interconnect structure.

Still referring to FIG. 5A, in operation 22, a ferroelectric layer 106 is formed over the conductive layer 104 and the dielectric layer 102. In operation 23, a metal oxide semiconductor layer 108 is formed over the ferroelectric layer 106.

Figure 5B:
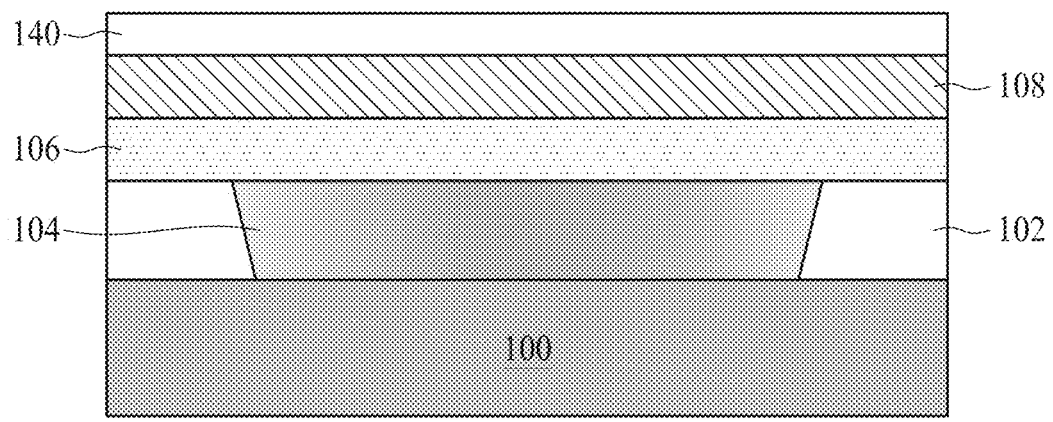

Referring to FIG. 5B, in some embodiments, a dielectric layer 140 is formed over the metal oxide semiconductor layer 108. In some embodiments, the dielectric layer 140 may be an inter-metal dielectric (IMD) of the BEOL interconnect structure. A material of the dielectric layer 140 and a material of the dielectric layer 102 may be the same, but the disclosure is not limited thereto. In other embodiments, the dielectric layer 140 may be a blocking layer.

Figure 5C:
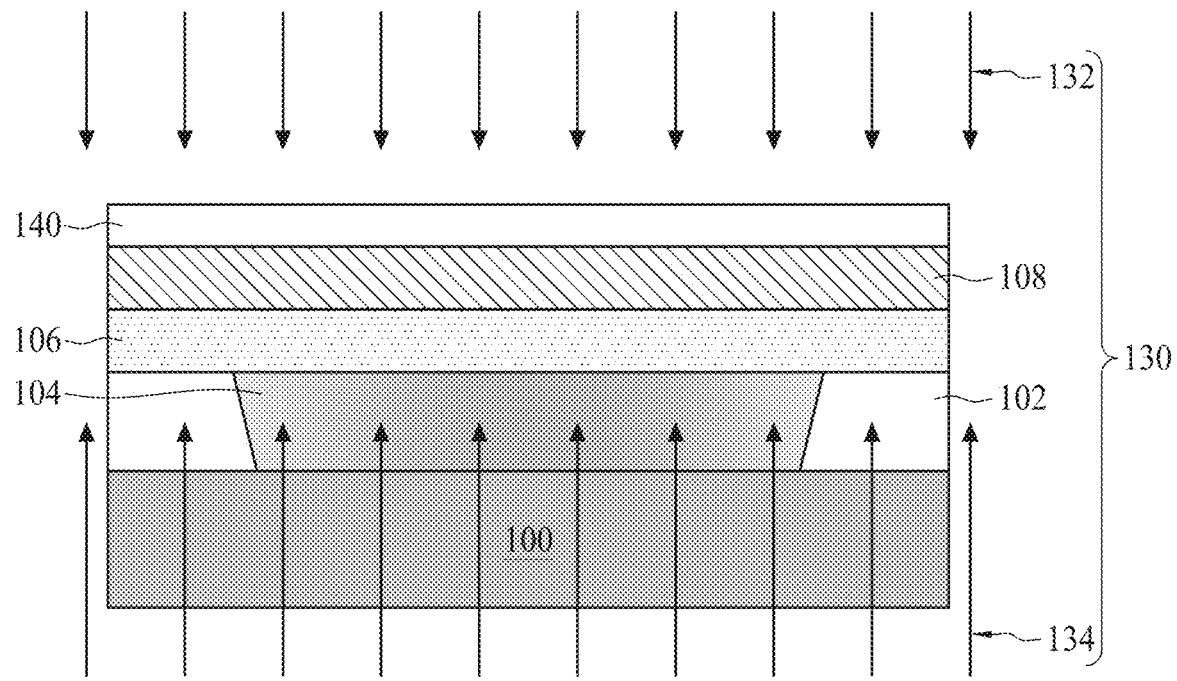

Referring to FIG. 5C, in operation 24, an SUT treatment 130 is performed on the ferroelectric layer 106, the metal oxide semiconductor layer 108 and the dielectric layer 140. As mentioned above, the SUT treatment 130 includes a UV radiation 132 and an anneal 134. In some embodiments, the UV radiation 132 is performed on a surface of the dielectric layer 140; however, the UV radiation 132 may penetrate the dielectric layer 140 and have effect on both the metal oxide semiconductor layer 108 and the ferroelectric layer 106. In some embodiments, the anneal 134 is performed using a furnace or a hot plate, and the substrate 100 is disposed thereon, so that heat is transferred in a direction from the substrate 100 to the ferroelectric layer 106 and the metal oxide semiconductor layer 108. In other words, an incident direction of the UV radiation 132 and a heat transferring direction of the anneal 134 are opposite to each other. In some embodiments, oxygen may be introduced during the SUT treatment 130. The introduced oxygen may help further mitigate the oxygen vacancy issue.

As mentioned above, according to the method 20, film qualities of both the ferroelectric layer 106 and the metal oxide semiconductor layer 108 are improved by the SUT treatment 130. In contrast with comparative approaches, the temperature and duration of the SUT treatment 130 are reduced, and thus the method 20 is more suitable in BEOL interconnect fabrication.

Figure 5D:
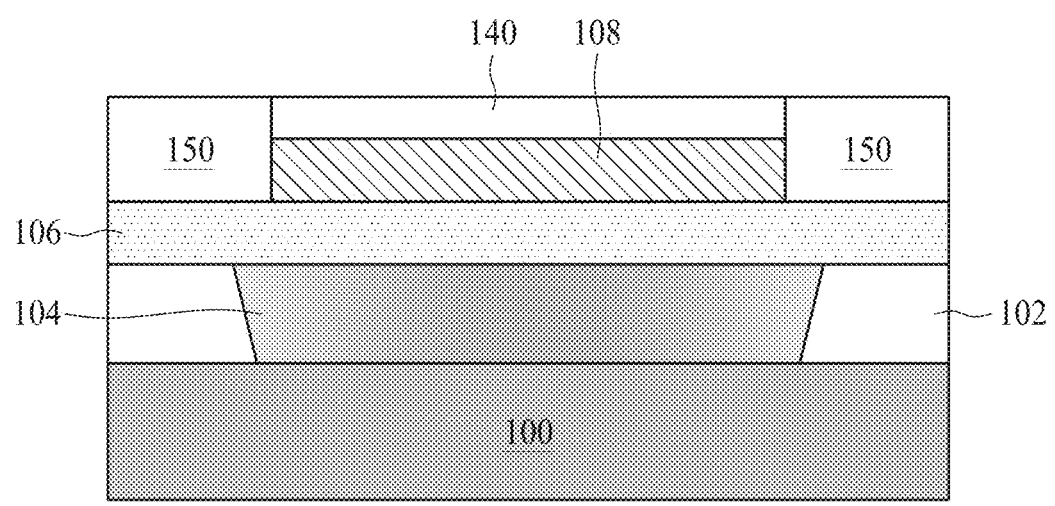

Referring to FIG. 5D, in some embodiments, conductive structures 150 may be formed in the dielectric layer 140. In some embodiments, the conductive structures 150 may include materials that are same as those of the conductive layer 104, but the disclosure is not limited thereto. In some embodiments, sidewalls of the conductive structures 150 may be in contact with the dielectric layer 140 and the metal oxide semiconductor layer 108, and a bottom surface of the conductive structures 150 may be in contact with the ferroelectric layer 106.

In some embodiments, the conductive layer 104 may serve as a gate electrode, and the conductive structures 150 may serve as a source electrode and a drain electrode.

According to the methods 10 and 20, it is concluded that the SUT treatments 110, 120 and 130 may be performed directly after the forming of the ferroelectric layer 106 or directly after the forming of the metal oxide semiconductor layer 108. The SUT treatments 120 and 130 may further be performed after the forming of the metal oxide semiconductor layer 108 and after the forming of another layer (i.e., the dielectric layer 140). In some embodiments, the SUT treatments 110, 120 and 130 may be performed prior to a forming of a material having a reflection coefficient greater than that of the dielectric layer 140. For example, the SUT treatments 110, 120 and 130 are performed prior to the forming of the conductive structures 150.

Figure 6:
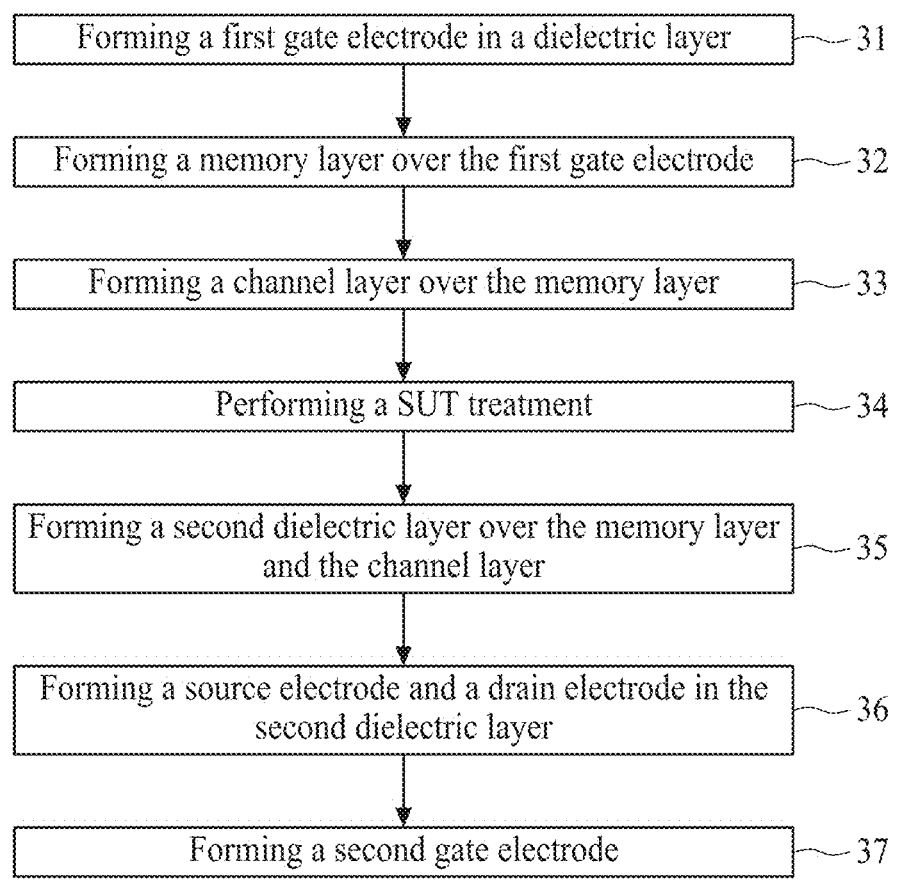
FIG. 6 is a flow diagram of some embodiments of a method of forming a semiconductor structure according to aspects of the present disclosure in one or more embodiments.

FIG. 6 is a flow diagram of some embodiments of a method of forming a semiconductor structure 30, and FIGS. 7A to 7J are schematic drawings illustrating the method of forming the semiconductor structure at various fabrication stages according to aspects of the present disclosure in one or more embodiments. Further, similar elements in FIGS. 2A to 2D and FIGS. 7A to 7J can include similar materials, and thus repeated descriptions of such details are omitted in the interest of brevity. The method 30 includes a number of operations (31, 32, 33, 34, 35, 36 and 37). The method 30 will be further described according to one or more embodiments. It should be noted that the operations of the method 30 may be rearranged or otherwise modified within the scope of the various aspects. It should be further noted that additional processes may be provided before, during, and after the method 30, and that some other processes may be only briefly described herein. Thus, other implementations are possible within the scope of the various aspects described herein.

Figure 7A:
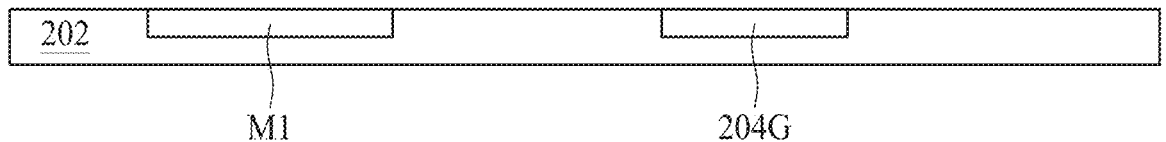
FIGS. 7A to 7J are schematic drawings illustrating the method of forming the semiconductor structure at various fabrication stages according to aspects of the present disclosure in one or more embodiments.

Referring to FIG. 7A, in operation 31, a first gate electrode 204G is formed in a dielectric layer 202. In some embodiments, the dielectric layer 202 may be similar to the dielectric layer 102, and the first gate electrode 204G may be similar to the conductive layer 104 shown in FIGS. 2A and 4A. Further, the dielectric layer 202 may be formed over a semiconductor substrate. The forming of the first gate electrode 204G may include further operations. For example, in some embodiments, a trench (not shown) may be formed in the first dielectric layer 202. A conductive material may be deposited to fill the trench, and a planarization operation may be performed to remove a superfluous portion of the conductive material to form the first gate electrode 204G in the dielectric layer 202.

In some embodiments, the method 30 is integrated with a forming of a BEOL interconnect structure. In such embodiments, the first gate electrode 204G may be an Mn metal layer of a BEOL interconnect structure, and the dielectric layer 202 may be an Nth inter-metal dielectric (IMDn) layer. For example, the dielectric layer 202 may be a first inter-metal dielectric (IMD1) layer, but the disclosure is not limited thereto. Further, a conductive layer may be simultaneously formed in the dielectric layer 202 and serve as a metal layer such as a first metal layer M1. In some embodiments, a top surface of the first metal layer M1 is substantially aligned with a top surface of the dielectric layer 202 and a top surface of the first gate electrode 204G. In some embodiments, the first gate electrode 204G serves as a buried gate electrode.

Figure 7B:
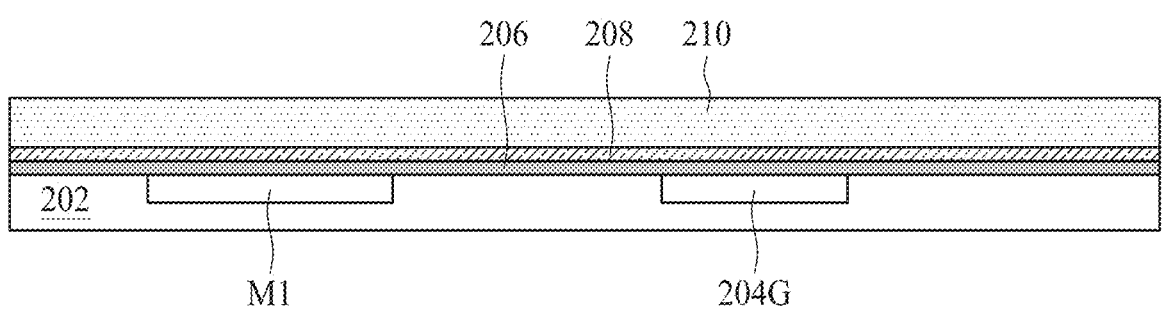

Referring to FIG. 7B, in some embodiments, a buffer layer 206 may be disposed over the dielectric layer 202, the first gate electrode 204G and the first metal layer M 1. Further, the top surfaces of the dielectric layer 202, the first gate electrode 204G and the first metal layer M1 are entirely covered by the buffer layer 206. The buffer layer 206 may have materials with coefficients of thermal expansion (CTE) greater than that of the underlying first gate electrode 204G.

In some embodiments, the buffer layer 206 may include metal oxides, alkali metal oxides, alkali earth oxides, and semiconductor oxides. In some embodiments, the buffer layer 206 may be a single layer including, for example but not limited thereto, tantalum oxide ($Ta_2O_5$), a-titanium oxide (a-$Ti_2O_3$), a-indium oxide (a-$In_2O_3$), a-ferrous oxide (a-$Fe_2O_3$), potassium oxide ($K_2O$), rubidium oxide ($Rb_2O$), strontium oxide (SrO), barium oxide (BaO), a-vanadium oxide (a-$V_2O_3$), a-chromium oxide (a-$Cr_2O_3$), yttrium-aluminum oxide ($YAlO_2$), ytterbium oxide ($Yb_2O_3$), dysprosium oxide ($Dy_2O_3$), gadolinium oxide ($Gd_2O_3$), a-gallium oxide (a-$Ga_2O_3$), strontium titanate ($SrTiO_3$), dysprosium scandate ($DyScO_3$), terbium scandate ($TbScO_3$), gadolinium scandate ($GdScO_3$), neodymium scandate ($NdScO_3$), neodymium gallate ($NdGaO_3$), and/or lanthanum strontium aluminate ($LaSrAlO_3$, LSAT). In some embodiments, the buffer layer 206 may be a bi-layered structure including lanthanum strontium manganite ($LaSrMnO_3$, LSMO) and $SrTiO_3$, LSMO and $DyScO_3$, LSMO and $GdScO_3$, LSMO and $NdScO_3$, LSMO and $NdGaO_3$, or LSMO and LSAT. In some embodiments, because the CTE of the buffer layer 206 is greater than the CTE of the underlying first gate electrode 204G, a tensile stress may be generated. Accordingly, the buffer layer 206 can be referred to as a stress layer.

In some embodiments, a seed layer 208 may be formed over the buffer layer 206. The seed layer 208 may be formed by an atomic layer deposition (ALD) or a pulse layer deposition (PLD), but the disclosure is not limited thereto. In some embodiments, the seed layer 208 may be a single-layered structure. In some alternative embodiments, the seed layer 208 may be a multi-layered structure. In some embodiments, the seed layer 208 may include zirconium oxide of cubic-phase (c-phase), tetragonal phase (t-phase) or orthorhombic phase (o-phase), zirconium yttrium oxide of c-phase, t-phase or o-phase, hafnium oxide of c-phase, t-phase or o-phase, aluminum oxide of c-phase, t-phase or o-phase, and/or hafnium zirconium oxide of c-phase, t-phase or o-phase. For example, the seed layer 208 may include c-phase, t-phase or o-phase zirconium dioxide ($ZrO_2$), c-phase, t-phase or o-phase zirconium dioxide and diyttuim trioxide ($ZrO_2$—$Y_2O_3$), c-phase, t-phase or o-phase hafnium dioxide ($HfO_2$), c-phase, t-phase or o-phase dialuminum trioxide ($Al_2O_3$), c-phase, t-phase or o-phase hafnium zirconium oxide ($Hf_xZr_{1-x}O_y$), or a combination thereof, wherein x of $Hf_xZr_{1-x}O_y$ can be varied from 0 to 1.

Still referring to FIG. 7B, in operation 32, a memory layer 210 is formed over the seed layer 208, the buffer layer 206 and the first gate electrode 204G. The memory layer 210 may be similar to the ferroelectric layer 106 shown in FIGS. 2A and 4A; therefore, repeated descriptions are omitted for brevity. In some embodiments, the method 30 may be integrated with the method 10; thus, an SUT treatment 110 is performed on the memory layer (i.e., the ferroelectric layer) 210. Accordingly, a film quality of the formed memory layer 210 is improved.

Figure 7C:
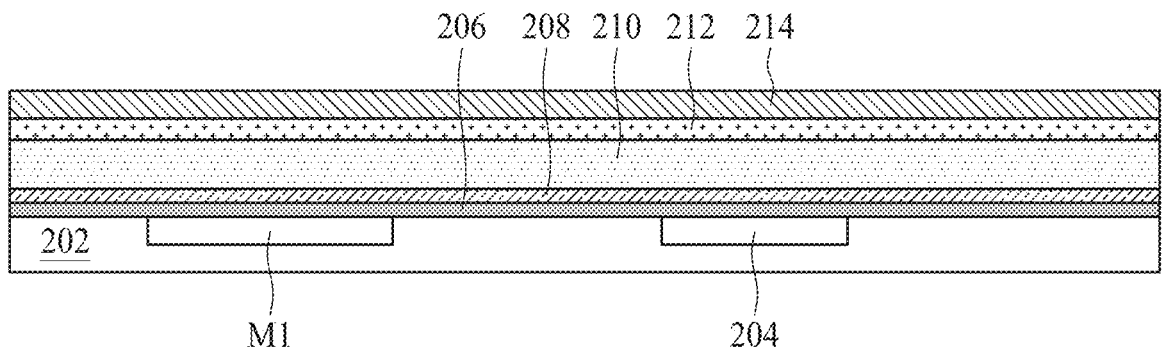

Referring to FIG. 7C, in some embodiments, a blocking layer 212 may be formed over the memory layer 210 after the forming of the memory layer 210. In some embodiments, the blocking layer 212 may be formed after the performing of the SUT treatment 110. In some alternative embodiments, the SUT treatment 110 may be performed after the forming of the blocking layer 212. In such embodiments, the UV radiation 112 penetrates the blocking layer 212 to reach the memory layer 210.

Still referring to FIG. 7C, in some embodiments, in operation 33, a channel layer 214 is formed over the memory layer 210 and the blocking layer 212. The channel layer 214 may be similar to the metal oxide semiconductor layer 108 shown in FIGS. 2A and 4A; therefore, repeated descriptions are omitted for brevity.

In some embodiments, the method 30 is integrated with the method 10; thus, an SUT treatment 120 is performed. For example, in operation 34, an SUT treatment 120 is performed on the channel layer 214. The SUT treatment 120 is similar to the SUT treatments described above; therefore, repeated descriptions are omitted for brevity. Consequently, as a result of the SUT treatment 120, a film quality of the channel layer 214 is improved.

In some embodiments, the method 30 may be integrated with the method 20. In such embodiments, the SUT treatment 130 is performed after the forming of the memory layer 210 and the forming of the channel layer 214. No intervening SUT treatment is required.

Figure 7D:
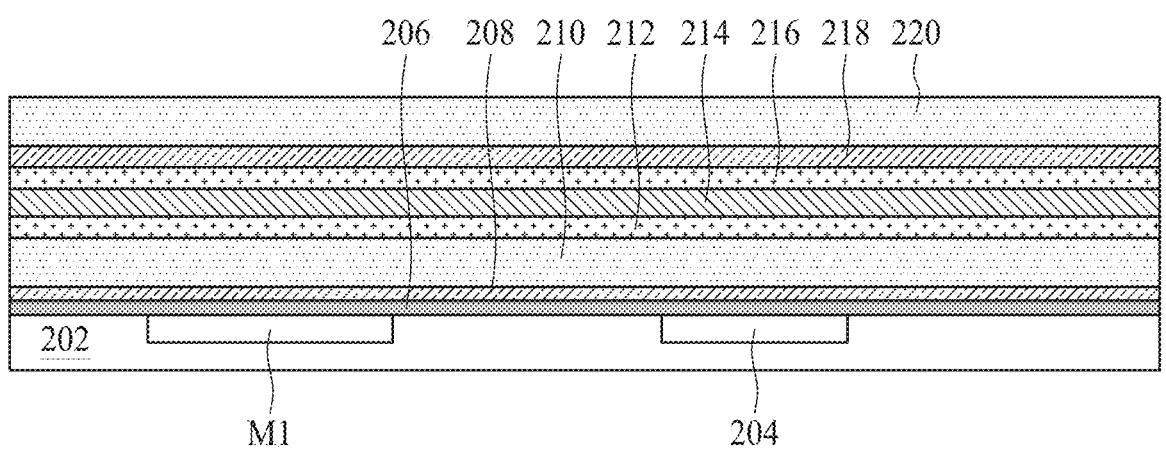

Referring to FIG. 7D, in some embodiments, another blocking layer 216, another seed layer 218 and another memory layer 220 may be formed over the channel layer 214. In some embodiments, the operation 34 may be performed after each of the forming of the memory layer 210, the forming of the channel layer 214 and the forming of the memory layer 220. In some embodiments, the operation 34 is performed after the forming of the memory layer 210, the forming of the channel layer 214 and the forming of the memory layer 220, and no intervening SUT treatment is required.

Figure 7E:
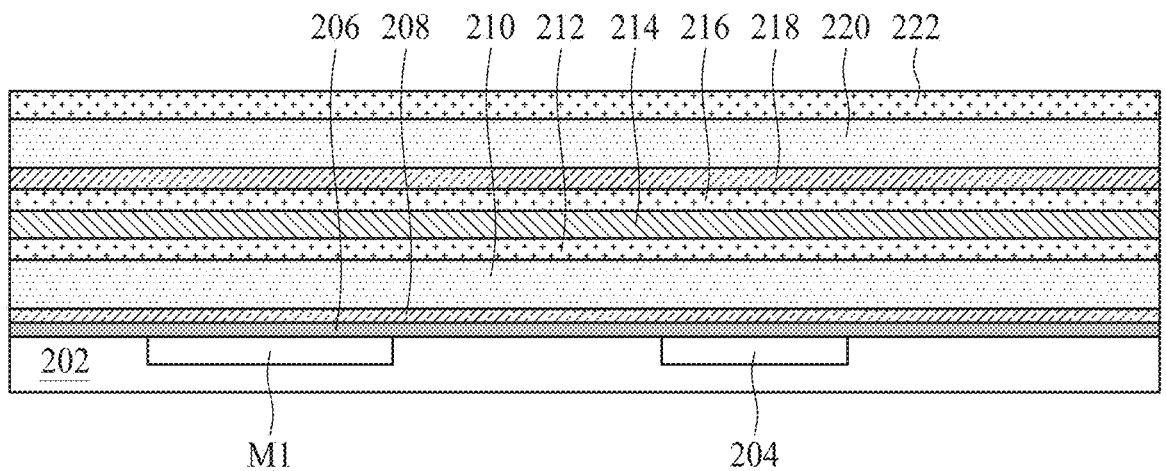

Referring to FIG. 7E, in some embodiments, a blocking layer 222 is formed over the memory layer 220. In some embodiments, the operation 34 may be performed prior to the forming of the blocking layer 222. In some alternative embodiments, the operation 34 may be performed after the forming of the blocking layer 222.

Figure 7F:
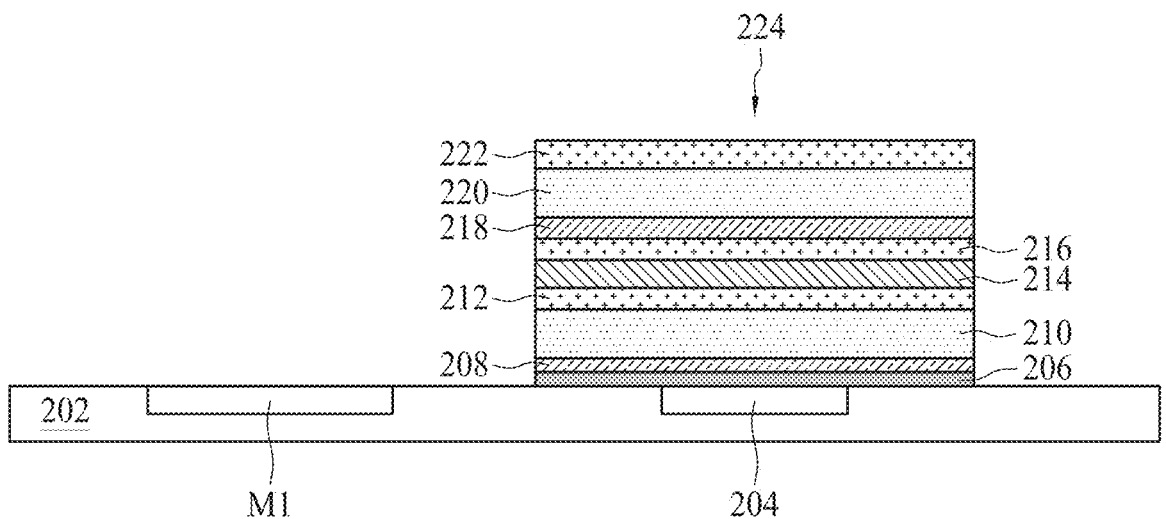

Referring to FIG. 7F, in some embodiments, the above-mentioned layers 206, 208, 210, 212, 214, 216, 218, 220 and 222 are patterned. Consequently, a multilayer structure 224 is obtained over the dielectric layer 202. As shown in FIG. 7F, the multilayer structure 224 is in contact with the first gate electrode 204. Further, the multilayer structure 224 is separated from the first metal layer M1.

Figure 7G:
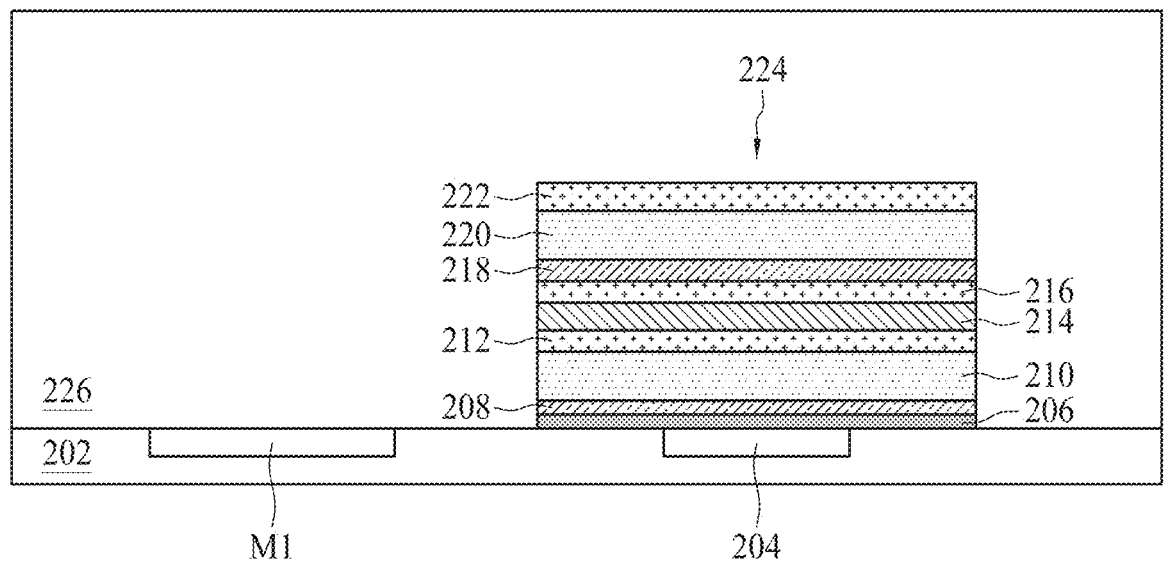

Referring to FIG. 7G, in some embodiments, in operation 35, a dielectric layer 226 is formed over the multilayer structure 224. In some embodiments, a material used to form the dielectric layer 226 and a material used to form the dielectric layer 202 may be the same, but the disclosure is not limited thereto. Further, a thickness of the dielectric layer 226 is greater than a thickness (or a height) of the multilayer structure 224, such that the multilayer structure 224 is entirely embedded in the dielectric layer 226.

In some embodiments, the method 30 may be integrated with the method 20. In such embodiments, the SUT treatment 130 is performed after the forming of the memory layer 210, the forming of the channel layer 214, and the forming of the dielectric layer 226. No intervening SUT treatment is required.

Figure 7H:
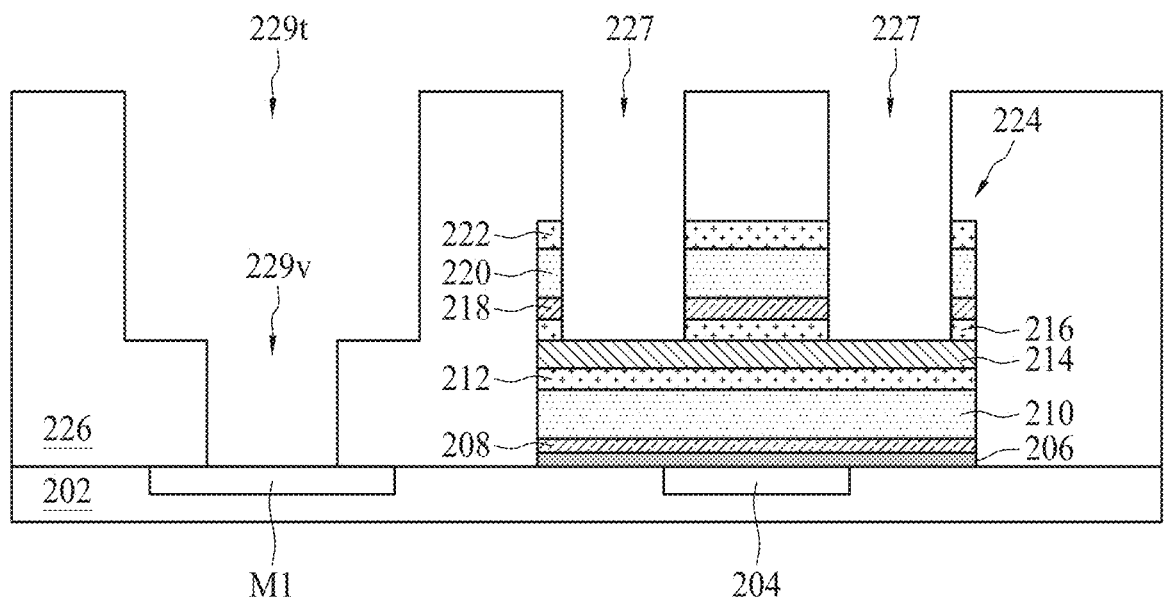

Referring to FIG. 7H, in some embodiments, a plurality of trenches 227 and 229t, and a via 229v coupled to the trench 229t are formed in the dielectric layer 226. The trenches 227 and 229t are separated from each other. Further, the trenches 227 are separated from the via 229v. In some embodiments, a bottom of the trench 229t may be aligned with bottoms of the trenches 227, as shown in FIG. 7H, but the disclosure is not limited thereto. In some embodiments, portions of the multilayer structure 224 are exposed through the trenches 227. For example, portions of the channel layer 214 are exposed through the bottoms of the trenches 227. In some embodiments, the first metal layer M1 may be exposed through a bottom of the via 229v.

Figure 7I:
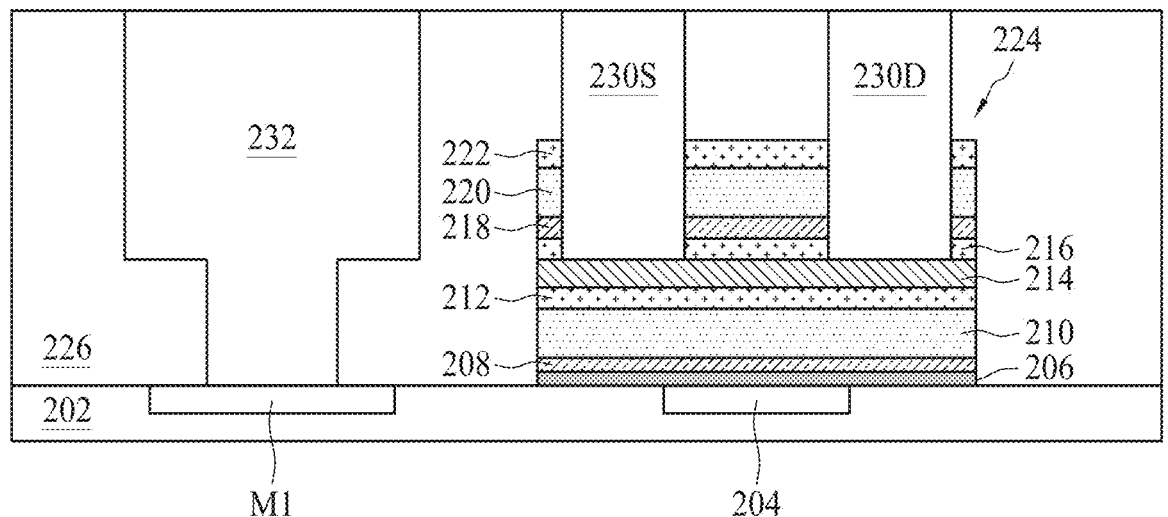

Referring to FIG. 7I, in some embodiments, in operation 36, a source electrode 230S and a drain electrode 230D are formed in the trenches 227, and a connecting structure 232 is formed in the trench 229t and the via 229v. In some embodiments, the forming of the source electrode 230S, the drain electrode 230D and the connecting structure 232 may include further operations. For example, a conductive material may be formed to fill the trenches 227 and 229t and the via 229v. A planarization operation such as a CMP may be performed to remove superfluous portions of the conductive material to form the source electrode 230S in one of the trenches 227, the drain electrode 230D in another trench 227, and the connecting structure 232 in the trench 229t and the via 229v. In some embodiments, a bottom of the source electrode 230S and a bottom of the drain electrode 230D are in contact with the channel layer 214. A bottom of the connecting structure 232 is in contact with the first metal layer M 1. Further, a top surface of the source electrode 230S, a top surface of the drain electrode 230D, and a top surface of the connecting structure 232 are aligned with (i.e., coplanar with) each other.

Figure 7J:
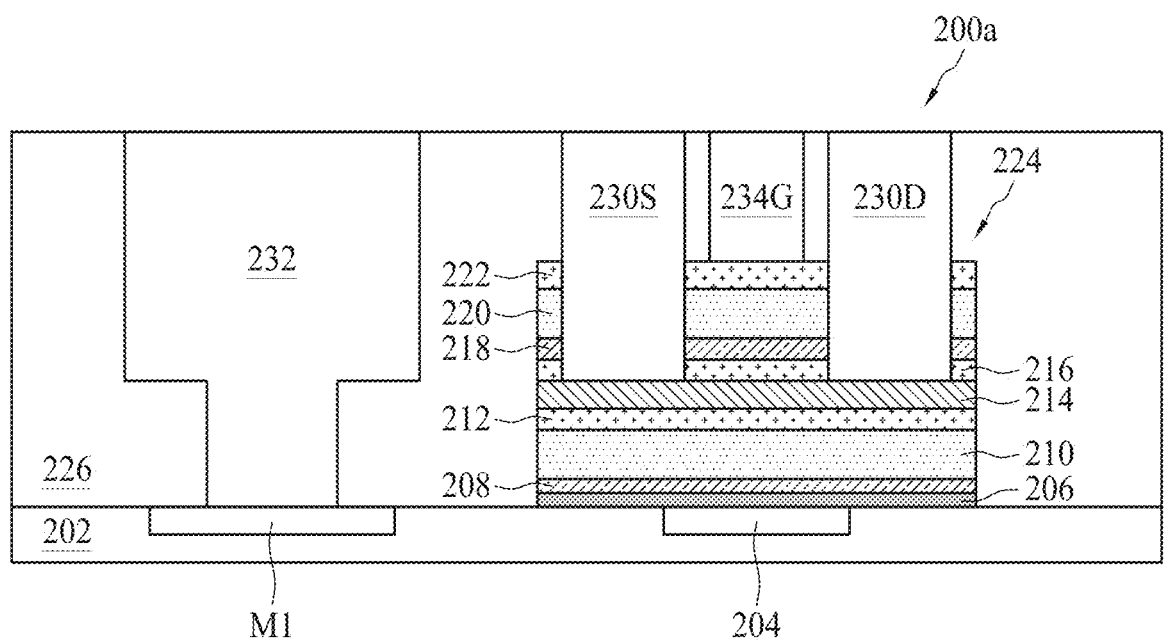

Referring to FIG. 7J, in some embodiments, in operation 37, a second gate electrode 234G is formed in the dielectric layer 226. In some embodiments, the forming of the second gate electrode 234G may include further operations. For example, a third trench (not shown) is formed in the dielectric layer 226. The third trench may be formed between the source electrode 230S and the drain electrode 230D. Further, the blocking layer 222 may be exposed through a bottom of the third trench. A conductive material may be formed to fill the third trench, and a planarization operation such as a CMP may be performed to remove superfluous portions of the conductive layer to form the second gate electrode 234G. In some embodiments, a material of the second gate electrode 234G and a material of the source electrode 230S may be the same, the drain electrode 230D and the connecting structure 232.

According to the method 30, which may be integrated with the method 10 or the method 20, a memory device 200a may be formed with the forming of the BEOL interconnect structure. Further, the SUT treatment, which use the UV radiation and the anneal with the temperature less than 400° C., may help improve the film qualities of the memory layers 210 and 220 and the channel layer 214 with less thermal impact to the conductive layers M 1 and the first gate electrode 204. As mentioned above, the operation 34 (i.e., the SUT treatment) may be performed at many time points as long as prior to the forming of the conductive structures (i.e., the source electrode 230S and the drain electrode 230D). Therefore process flexibility may be further improved.

Figure 8A:
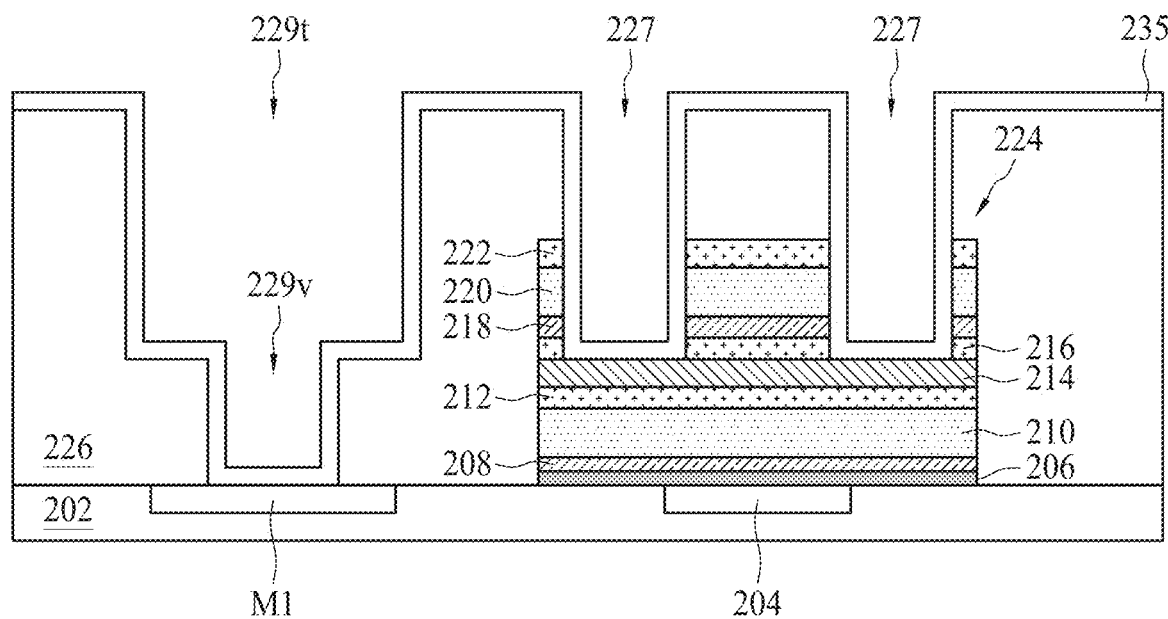
FIGS. 8A to 8E are schematic drawings illustrating the method of forming the semiconductor structure at various fabrication stages according to aspects of the present disclosure in one or more embodiments.

Please refer to FIGS. 8A to 8E, which are schematic drawings illustrating the method of forming the semiconductor structure at various fabrication stages according to aspects of the present disclosure in one or more embodiments. It should be noted that FIG. 8A is a drawing illustrating a stage subsequent to FIG. 7H. In some embodiments, after the forming of the trenches 227 and 229t and the via 229v, an insulating layer 235 is formed. As shown in FIG. 8A, the insulating layer 235 is conformally formed to cover a top surface of the dielectric layer 226, sidewalls of the first trenches 227, bottoms of the first trenches 227, sidewalls of the second trench 229t, a bottom surface of the second trench 229t, sidewalls of the via 229v and a bottom of the via 229v. In some embodiments, the insulating layer 235 includes a material different from that of the dielectric layer 226.

Figure 8B:
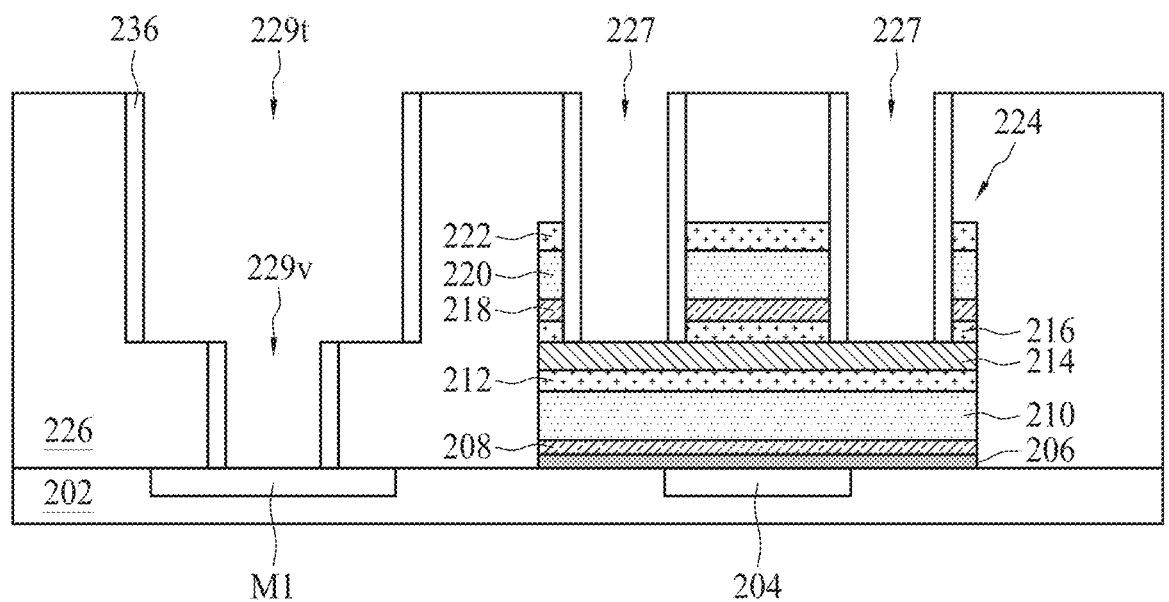

Referring to FIG. 8B, in some embodiments, portions of the insulating layer 235 are removed. In some embodiments, the removing of the portions of the insulating layer 235 may include a dry etching, but the disclosure is not limited thereto. Accordingly, spacers 236 covering the sidewalls of the trenches 227 and 229t and the sidewalls of the via 229v are formed. As shown in FIG. 8B, the first metal layer M1 is exposed through the bottom of the via 229v, and portions of the channel layer 214 are exposed through the bottoms of the trenches 227. Further, the top surface of the dielectric layer 226 is exposed. Additionally, portions of the dielectric layer 226 are exposed through the bottom of the trench 229t. Because the insulating layer 235 and the dielectric layer 226 include different materials, damage to the dielectric layer 226 during the forming of the spacers 236 may be mitigated.

Figure 8C:
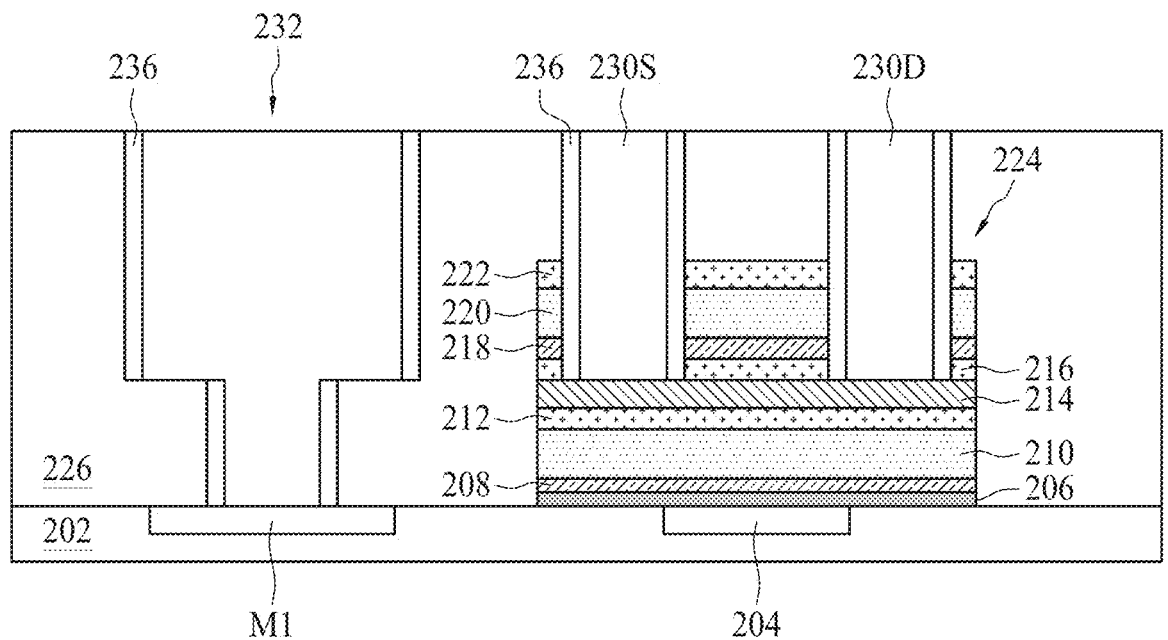

Referring to FIG. 8C, in some embodiments, in operation 36, a source electrode 230S and a drain electrode 230D are formed in the trenches 227, and a connecting structure 232 is formed in the trench 229t and the via 229v. Operations for forming the source electrode 230S, the drain electrode 230D and the connecting structure 232 are similar to those described above; therefore, repeated descriptions are omitted for brevity. As shown in FIG. 8C, a bottom of the source electrode 230S and a bottom of the drain electrode 230D are in contact with the channel layer 214. A bottom of the connecting structure 232 is in contact with the first metal layer M1. Further, a top surface of the source electrode 230S, a top surface of the drain electrode 230D, and a top surface of the connecting structure 232 are aligned with (i.e., coplanar with) each other.

Figure 8D:
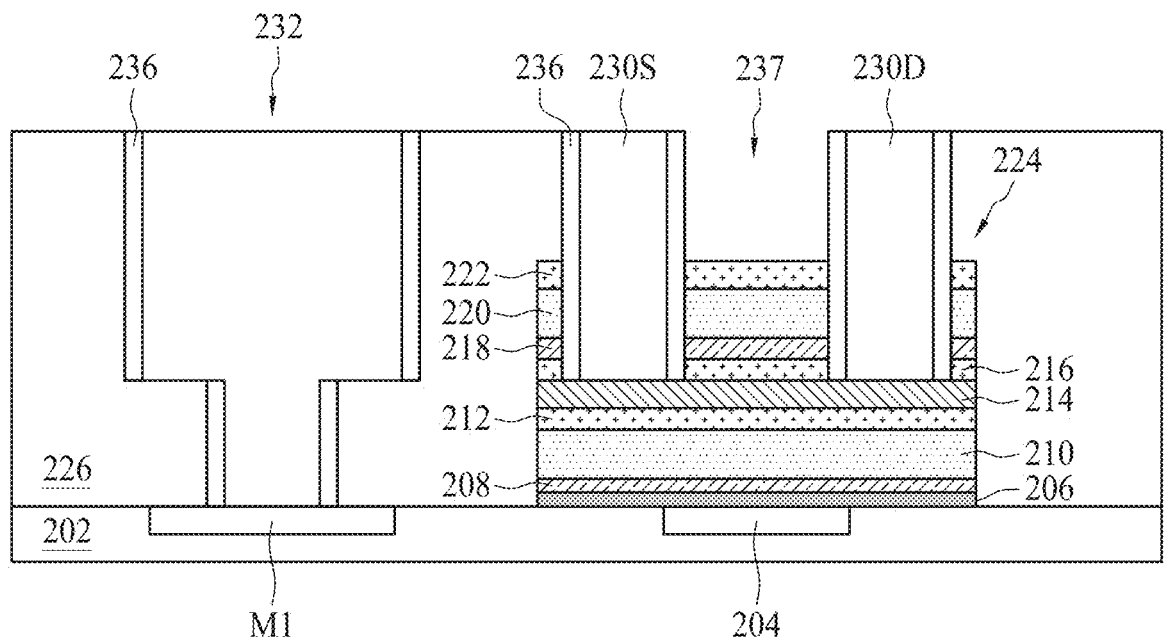

Referring to FIG. 8D, in some embodiments, a portion of the dielectric layer 226 is removed to form a trench 237. In some embodiments, the trench 237 is formed between the source electrode 230S and the drain electrode 230D. A portion of the blocking layer 222 is exposed through a bottom of the trench 237. Further, at least two sides of the trench 237 are lined by the spacer 236, as shown in FIG. 8D.

Figure 8E:
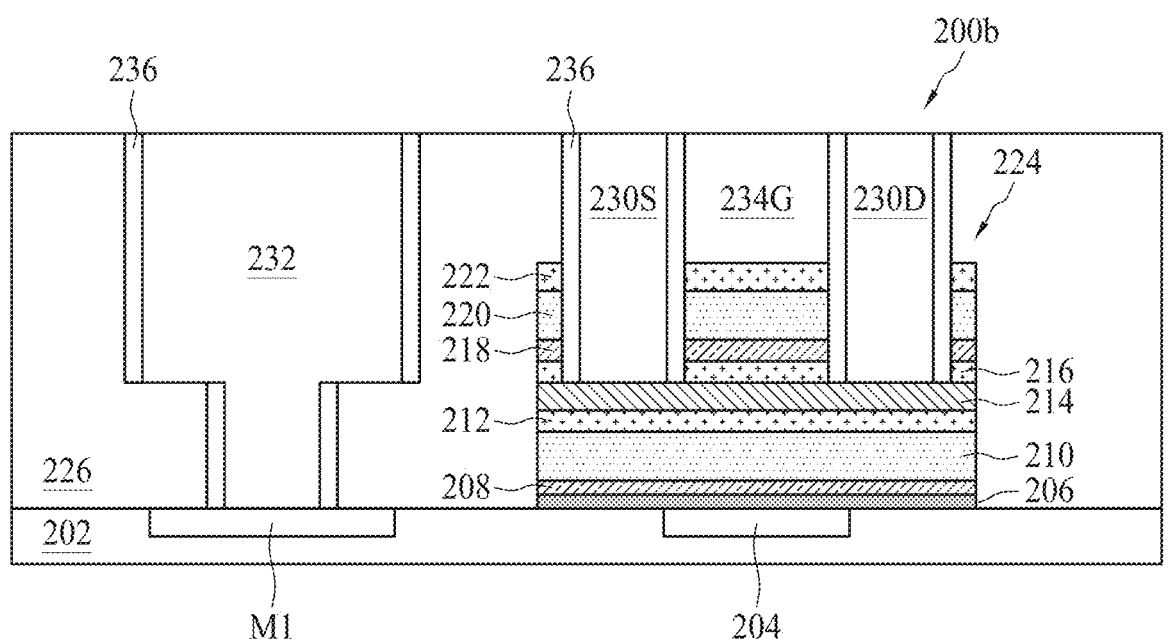

Referring to FIG. 8E, a second gate electrode 234G is formed in the trench 237. In some embodiments, the forming of the second gate electrode 234G may include further operations. For example, a conductive material may be formed to fill the trench 237, and a planarization operation such as a CMP may be performed to remove superfluous portions of the conductive material to form the second gate electrode 234G. As mentioned above, the second gate electrode 234G, the source electrode 230S, the drain electrode 230D and the connecting structure 232 may include a same material, but the disclosure is not limited thereto.

Accordingly, the methods 10, 20 and 30 may be used to form a FeFET memory structure in a BEOL interconnect structure. Further, the methods 10, 20 and 30 may be used to form a double-gate FeFET memory structure 200b in the BEOL interconnect structure.

Please refer to FIGS. 9A to 9J, which are schematic drawings illustrating the method of forming the semiconductor structure at various fabrication stages according to aspects of the present disclosure in one or more embodiments. Further, similar elements in FIGS. 7A to 7I and FIGS. 9A to 9J can include similar materials, and thus repeated descriptions of such details are omitted in the interest of brevity.

Figure 9A:
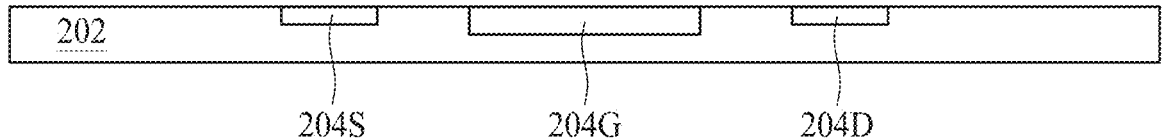
FIGS. 9A to 9J are schematic drawings illustrating the method of forming the semiconductor structure at various fabrication stages according to aspects of the present disclosure in one or more embodiments.

Referring to FIG. 9A, in operation 31, a first gate electrode 204G is formed in a dielectric layer 202. In some embodiments, the dielectric layer 202 may be similar to the dielectric layer 102, and the first gate electrode 204G may be similar to the conductive layer 104 shown in FIGS. 2A and 4A. Further, the dielectric layer 202 may be formed over a semiconductor substrate. In some embodiments a first source electrode 204S and a first drain electrode 204D are also formed in the dielectric layer 202. In some embodiments, the method 30 is integrated with a forming of a BEOL interconnect structure. Accordingly, the first gate electrode 204G, the first source electrode 204S and the first drain electrode 204D may be an Mn metal layer of an interconnect structure, and the dielectric layer 202 may be an Nth inter-metal dielectric (IMDn) layer. For example, the first dielectric layer 202 may be a first inter-metal dielectric (IMD1) layer, but the disclosure is not limited thereto. Further, another conductive layer may be formed in the dielectric layer 202 and serve as a metal layer such as a first metal layer M1. It should be noted that although the first metal layer M1 is omitted from FIGS. 9A to 9J, those skilled in the art will realize the first metal layer M1 according to FIGS. 7A to 7I. Additionally, in some embodiments, the first gate electrode 204G serves as a buried gate electrode, and the first source electrode 204S and the first drain electrode 204D serve as a buried source electrode and a buried drain electrode, respectively.

Figure 9B:
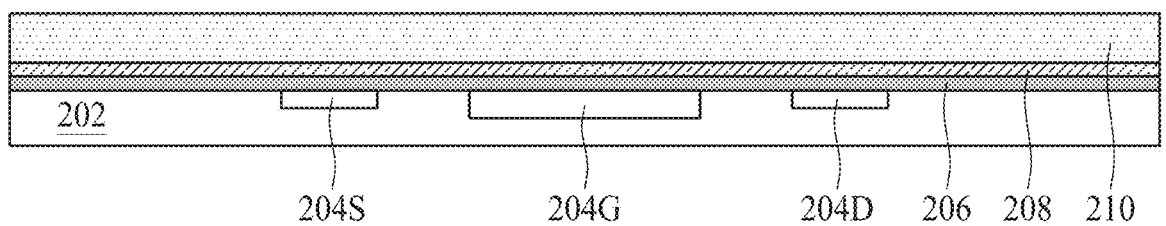

Referring to FIG. 9B, in some embodiments, a buffer layer 206 may be formed over the dielectric layer 202, the first gate electrode 204G, the first source electrode 204S and the first drain electrode 204D. As mentioned above, CTE of the buffer layer 206 is greater than the CTE of the underlying first gate electrode 204G, first source electrode 204S and first drain electrode 204D, and a tensile stress may therefore be generated. Accordingly, the buffer layer 206 can be referred to as a stress layer. In some embodiments, a seed layer 208 may be formed over the buffer layer 206.

Still referring to FIG. 9B, in operation 32, a memory layer 210 is formed over the seed layer 208. The memory layer 210 may be similar to the ferroelectric layer 106 shown in FIGS. 2A and 4A; therefore, repeated descriptions are omitted for brevity. In some embodiments, the method 30 may be integrated with the method 10; thus, an SUT treatment 110 is performed on the memory layer (i.e., the ferroelectric layer) 210. Accordingly, a film quality of the formed memory layer 210 is improved.

Figure 9C:
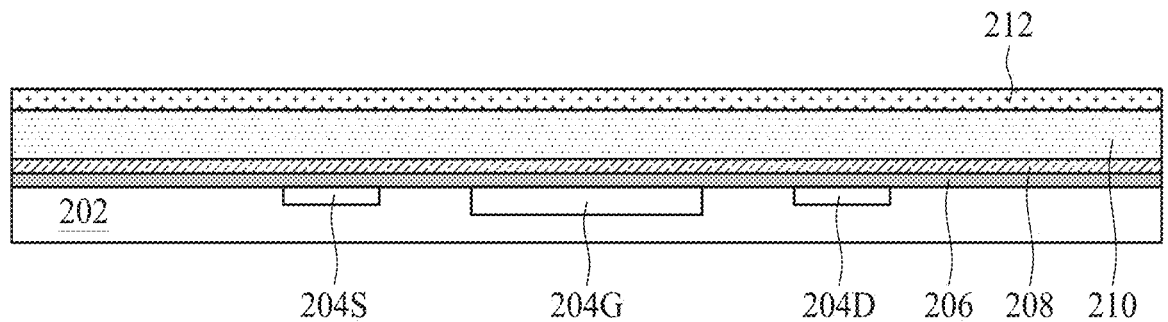

Referring to FIG. 9C, in some embodiments, a blocking layer 212 may be formed over the memory layer 210 after the forming of the memory layer 210. In some embodiments, the blocking layer 212 may be performed after the performing of the SUT treatment 110. In some alternative embodiments, the SUT treatment 110 may be performed after the forming of the blocking layer 212. In such embodiments, the UV radiation 112 penetrates the blocking layer 212 to reach the memory layer 210.

Figure 9D:
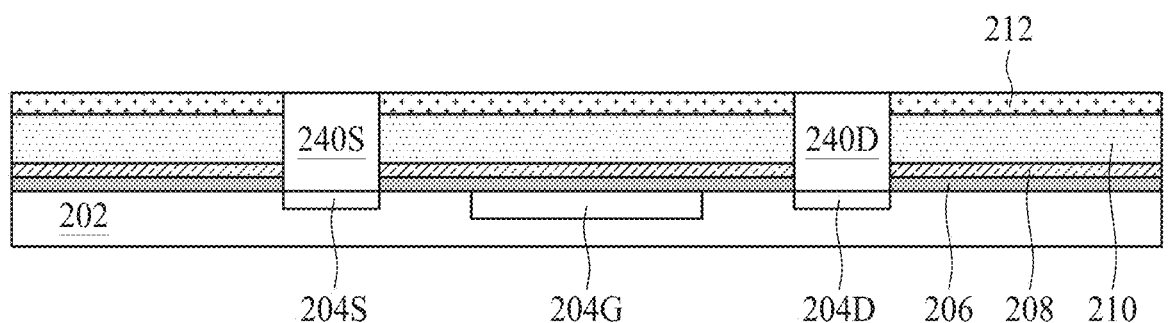

Referring to FIG. 9D, in some embodiments, a second source electrode 240S and a second drain electrode 240D are formed in the blocking layer 206, the seed layer 208, the memory layer 210 and the blocking layer 212. In some embodiments, trenches (not shown) may be formed in the blocking layer 206, the seed layer 208, the memory layer 210 and the blocking layer 212, using suitable etching methods. A conductive material is formed to fill the trenches, and a planarization is performed to remove superfluous conductive material. Thus, the second source electrode 240S and the second drain electrode 240D are formed in the above-mentioned layers. As shown in FIG. 9D, the second source electrode 240S is aligned with and in contact with the first source electrode 204S, and the second drain electrode 240D is aligned and in contact with the first drain electrode 204D. In some embodiments, the second source electrode 240S and the second drain electrode 240D may be referred to as a buried source interconnect metal and a buried drain interconnect metal, respectively.

Figure 9E:
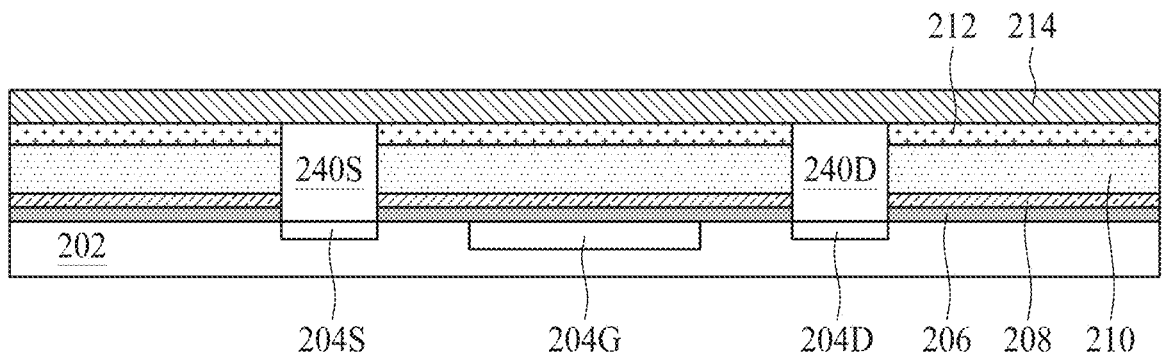

Referring to FIG. 9E, in some embodiments, in operation 33, a channel layer 214 is formed over the ferroelectric layer 210 and the blocking layer 212. The channel layer 214 may be similar to the metal oxide semiconductor layer 108 shown in FIGS. 2A and 4A; therefore, repeated descriptions are omitted for brevity. In some embodiments, the method 30 is integrated with the method 10; thus, an SUT treatment 120 is performed. For example, in operation 34, an SUT treatment 120 is performed on the channel layer 214. The SUT treatment 120 is similar to those described above; therefore, repeated descriptions are omitted for brevity. Consequently, by performing the SUT treatment 120, a film quality of the channel layer 214 is improved.

In some embodiments, the method 30 may be integrated with the method 20. In such embodiments, the SUT treatment 130 is performed after the forming of the memory layer 210 and the forming of the channel layer 214. No intervening SUT treatment is required.

Figure 9F:
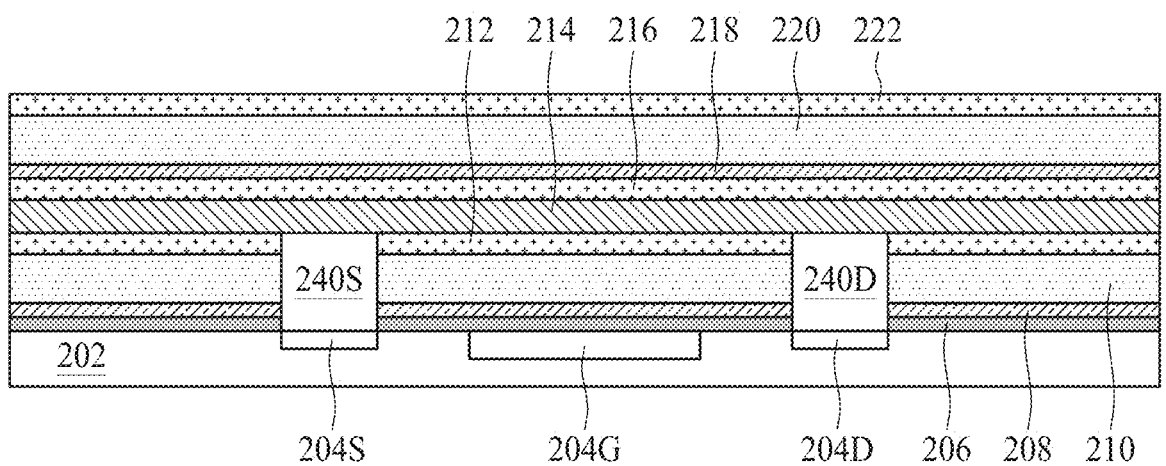

Referring to FIG. 9F, in some embodiments, another blocking layer 216, another seed layer 218, another memory layer 220 and a blocking layer 222 may be formed over the channel layer 214. In some embodiments, the operation 34 may be performed after each of the forming of the memory layer 210, the forming of the channel layer 214 and the forming of the memory layer 220. In some embodiments, the operation 34 is performed after the forming of the memory layer 210, the forming of the channel layer 214 and the forming of the memory layer 220, and no intervening SUT treatment is required.

Additionally, the operation 34 may be performed on the channel layer 214 directly after the forming of the channel layer 214, while another SUT treatment is performed after the forming of the memory layer 220 or after the forming of the blocking layer 222.

Figure 9G:
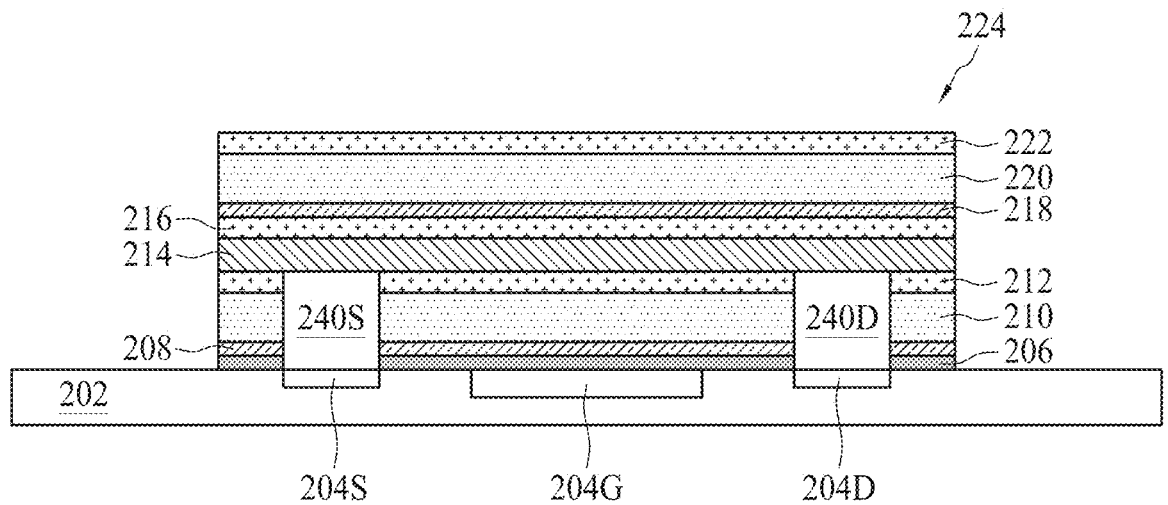

Referring to FIG. 9G, in some embodiments, the above-mentioned layers 208, 210, 212, 214, 216, 218, 220 and 222 are patterned. Consequently, a multilayer structure 224 is obtained over the dielectric layer 202.

Figure 9H:
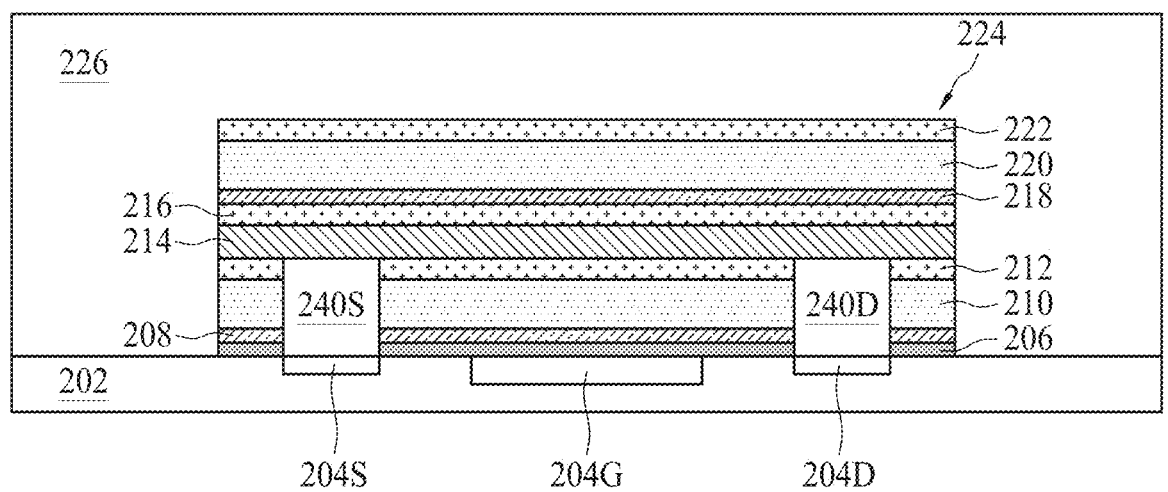

Referring to FIG. 9H, in some embodiments, in operation 35, a dielectric layer 226 is formed over the multilayer structure 224. In some embodiments, a material used to form the dielectric layer 226 and a material used to form the dielectric layer 202 may be the same, but the disclosure is not limited thereto. Further, a thickness of the dielectric layer 226 is greater than a thickness (or a height) of the multilayer structure 224, such that the multilayer structure 224 is entirely embedded in the second dielectric layer 226.

Figure 9I:
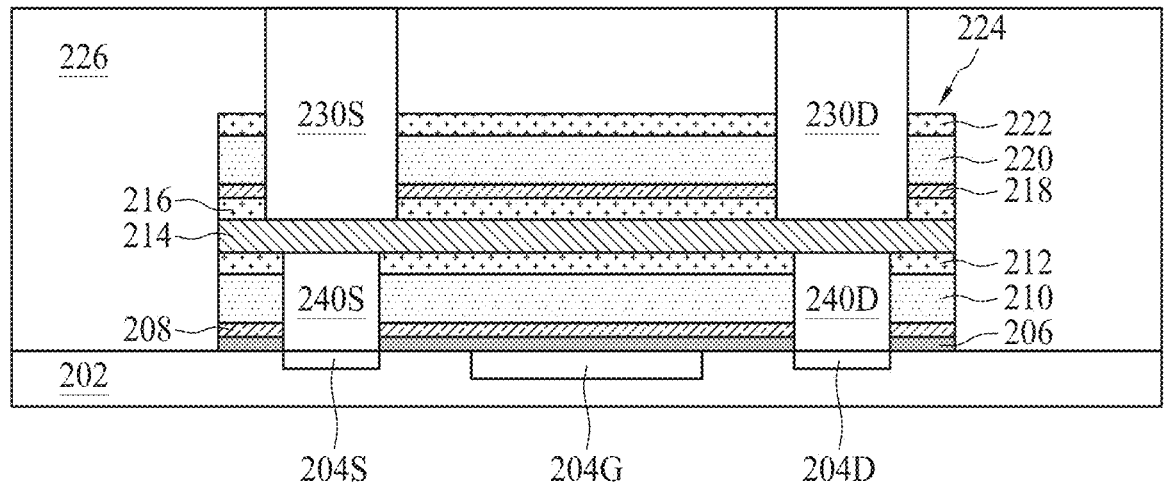

Referring to FIG. 9I, in some embodiments, a third source electrode 230S and a third drain electrode 230D are formed in the dielectric layer 226, the blocking layer 222, the memory layer 220, the seed layer 218 and the blocking layer 216. Further, a connecting structure may be also formed in the dielectric layer 226. The forming of the third source electrode 230S, the third drain electrode 230D and the connecting structure may be similar to the forming of similar elements described above; therefore, repeated descriptions are omitted for brevity. As shown in FIG. 9I, the third source electrode 230S is aligned with the second source electrode 240S, and the third drain electrode 230D is aligned with the second drain electrode 240D. In some embodiments, a bottom of the third source electrode 230S and a bottom of the third drain electrode 230D are in contact with the channel layer 214.

Figure 9J:
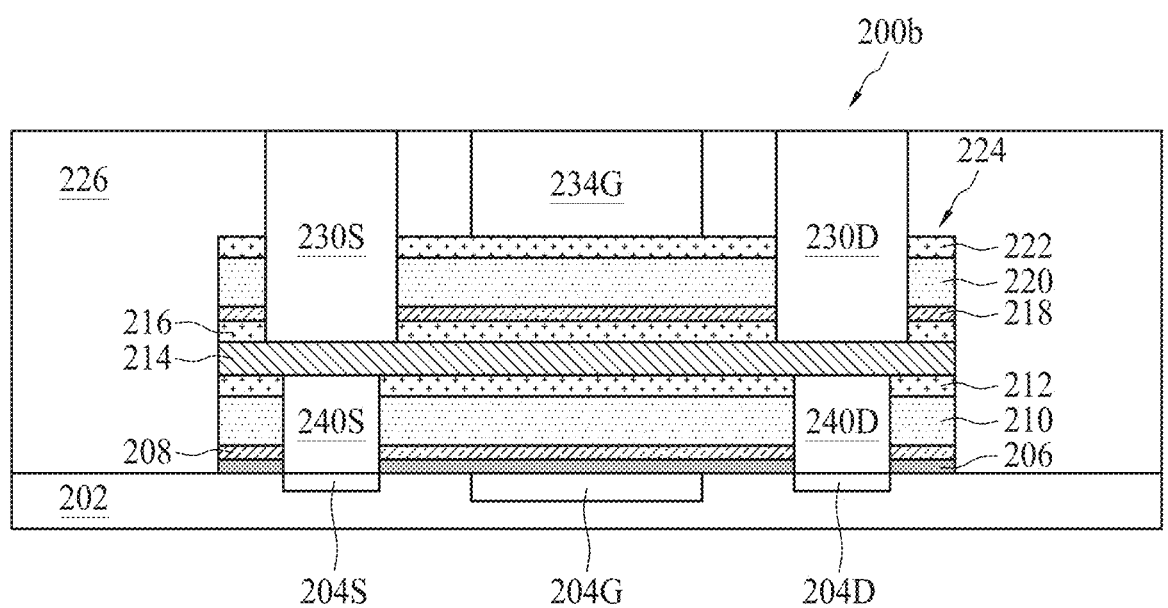

Referring to FIG. 9J, in some embodiments, a second gate electrode 234G is formed in the dielectric layer 226. The forming of the second gate electrode 234G may be similar to the forming of the gate electrodes described above; therefore, repeated descriptions are omitted for brevity. As shown in FIG. 9J, the second gate electrode 234G is formed between the third source electrode 230S and the third drain electrode 230D, and aligned with the first gate electrode 204G. Further, the second gate electrode 234G may be in contact with the blocking layer 222. As mentioned above, the second gate electrode 234G, the third source electrode 230S and the third drain electrode 230D may include a same material, but the disclosure is not limited thereto.

Figure 10A:
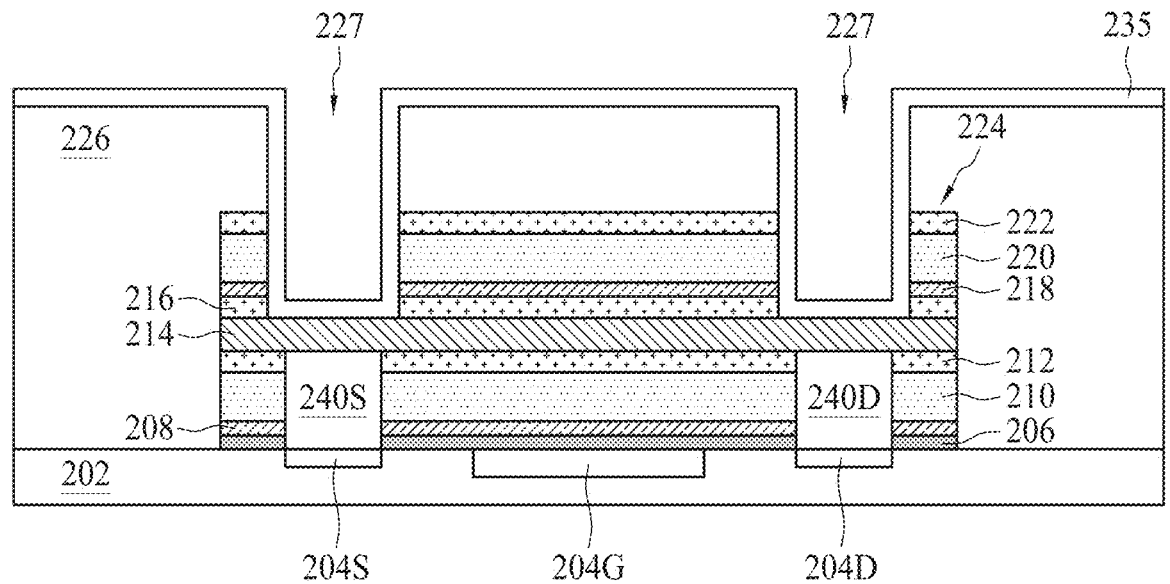
FIGS. 10A to 10E are schematic drawings illustrating the method of forming the semiconductor structure at various fabrication stages according to aspects of the present disclosure in one or more embodiments.

Please refer to FIGS. 10A to 10E, which are schematic drawings illustrating the method of forming the semiconductor structure at various fabrication stages according to aspects of the present disclosure in one or more embodiments. It should be noted that FIG. 10A is a drawing illustrating a stage subsequent to FIG. 9H. In some embodiments, after the forming of the dielectric layer 226, trenches 227 are formed. The trenches 227 are separated from each other. In some embodiments, an insulating layer 235 is conformally formed to cover a top surface of the dielectric layer 226, sidewalls of the trenches 227 and bottoms of the trenches 227. In some embodiments, the insulating layer 235 includes a material different from that of the dielectric layer 226.

Figure 10B:
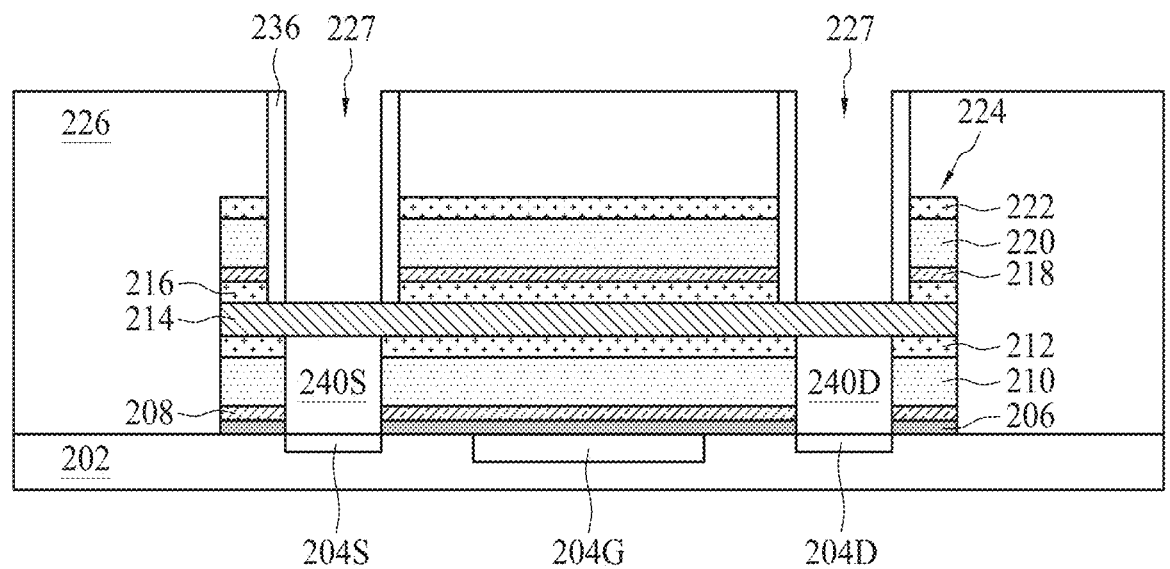

Referring to FIG. 10B, in some embodiments, portions of the insulating layer 235 are removed. Accordingly, spacers 236 covering the sidewalls of the trenches 227 are formed. As shown in FIG. 10B, portions of the channel layer 214 are exposed through the bottoms of the trenches 227. Further, the top surface of the dielectric layer 226 is exposed. Because the insulating layer 235 and the dielectric layer 226 include different materials, damage to the dielectric layer 226 during the forming of the spacers 236 may be mitigated.

Figure 10C:
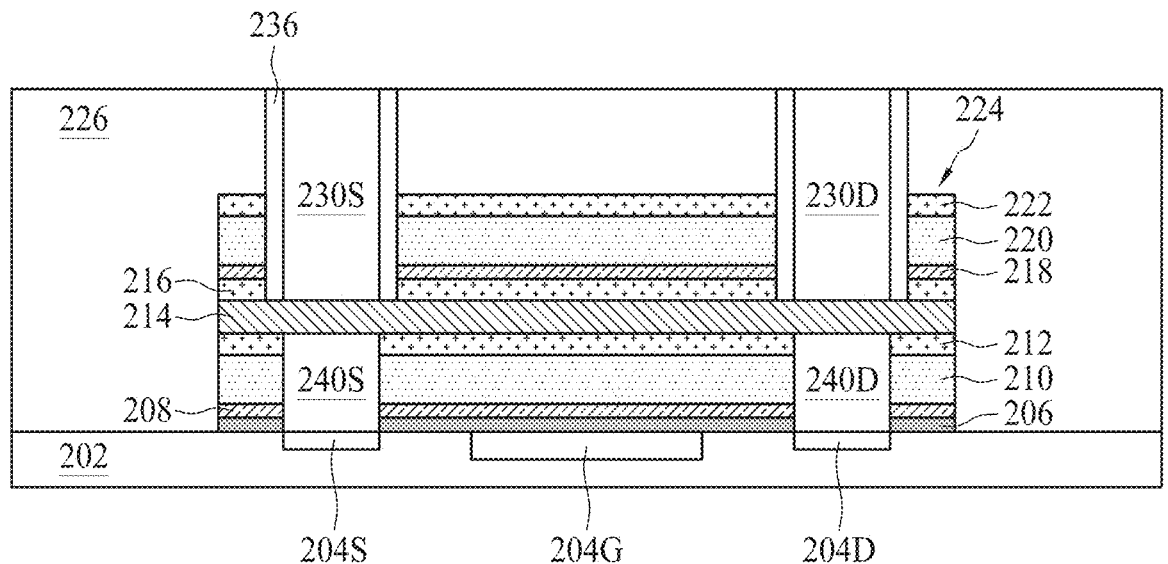

Referring to FIG. 10C, in some embodiments, a third source electrode 230S and a third drain electrode 230D are formed in the trenches 227. Operations for forming the third source electrode 230S and the third drain electrode 230D are similar to operation for forming similar elements described above; therefore, repeated descriptions are omitted for brevity. As shown in FIG. 10C, a bottom of the third source electrode 230S and a bottom of the third drain electrode 230D are in contact with the channel layer 214.

Figure 10D:
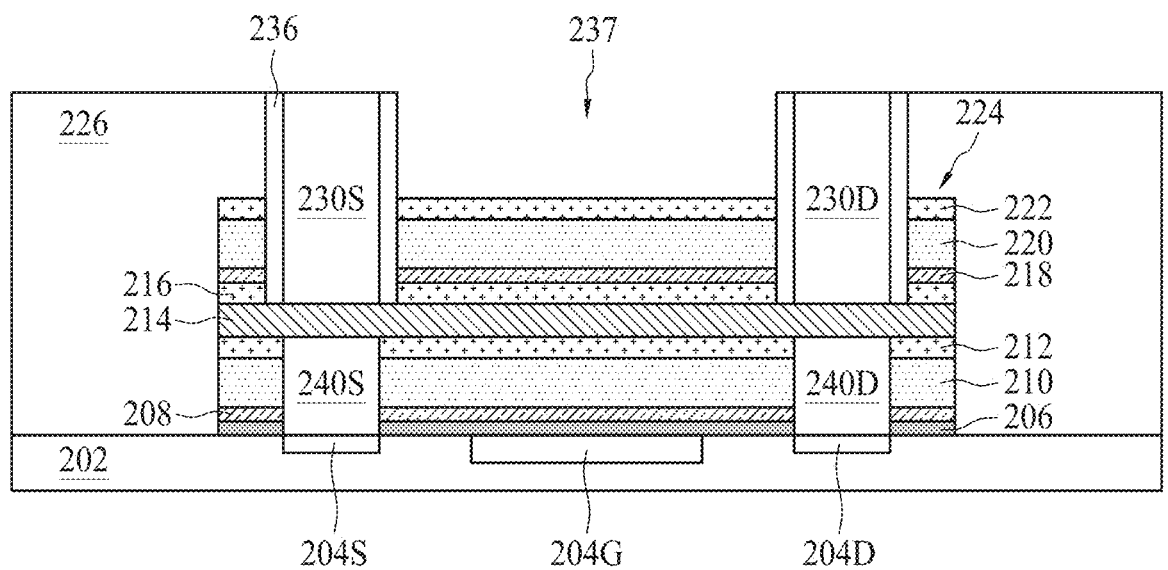

Referring to FIG. 10D, in some embodiments, a portion of the dielectric layer 226 is removed to form a trench 237. In some embodiments, the trench 237 is formed between the third source electrode 230S and the third drain electrode 230D. A portion of the blocking layer 222 may be exposed through a bottom of the trench 237. Further, at least two sides of the trench 237 are lines by the spacer 236, as shown in FIG. 10D.

Figure 10E:
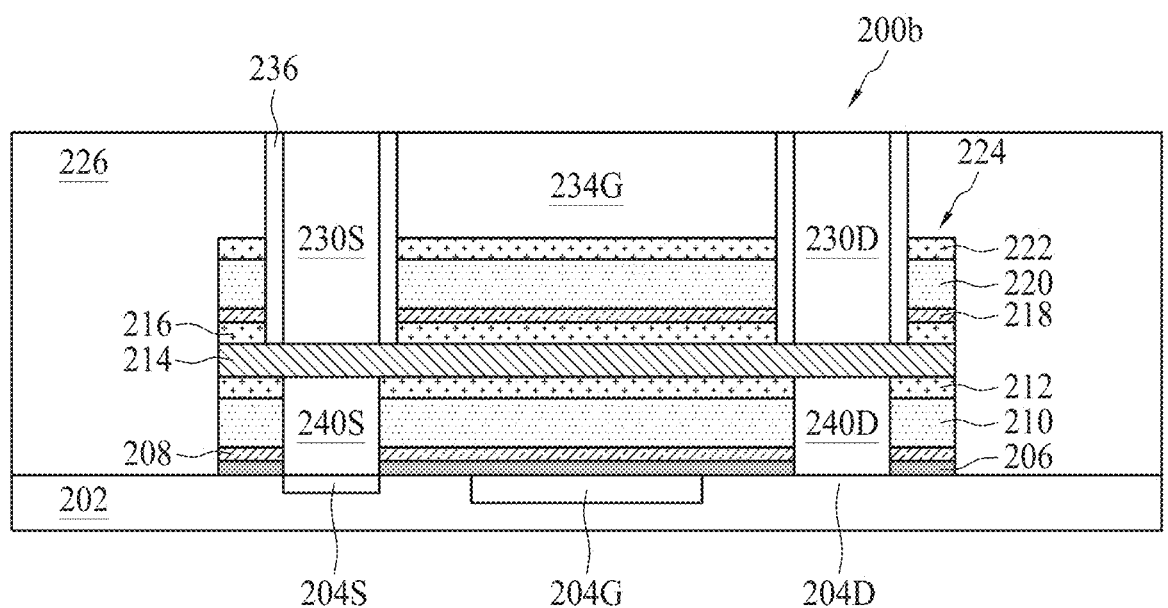

Referring to FIG. 10E, a second gate electrode 234G is formed in the trench 237. Operations for forming the second gate electrode 234G are similar to for forming gate electrodes described above; therefore, repeated descriptions are omitted for brevity. As mentioned above, the second gate electrode 234G, the third source electrode 230S, the third drain electrode 230D and the connecting structure 232 may include a same material, but the disclosure is not limited thereto.

According to the method 30, which may be integrated with the method 10 or the method 20, a memory device 200b may be formed with the forming of the BEOL interconnect structure. Further, the SUT treatment, which uses the UV radiation and the anneal with the temperature less than 400° C., may help improve film qualities of the memory layers 210 and 220 and the channel layer 214 with less thermal impact on the conductive layers and the first gate electrode 204. As mentioned above, the SUT treatment may be performed at many time points as long as it is performed prior to the forming of the conductive structures (i.e., the third source electrode 230S and the third drain electrode 230D). Therefore process flexibility may be further improved.

Accordingly, the methods 10, 20 and 30 may be used to form a FeFET memory structure in a BEOL interconnect structure. Further, the methods 10, 20 and 30 may be used to form a separated double-gate FeFET memory structure 200b in the BEOL interconnect structure.

Please refer to FIGS. 11A to 11K, which are schematic drawings illustrating the method of forming the semiconductor structure at various fabrication stages according to aspects of the present disclosure in one or more embodiments. Further, similar elements in FIGS. 7A to 7I and FIGS. 11A to 11K can include similar materials, and thus repeated descriptions of such details are omitted in the interest of brevity.

Figure 11A:
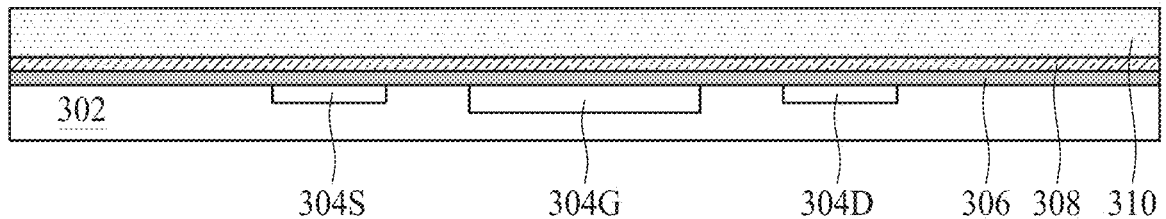
FIGS. 11A to 11K are schematic drawings illustrating the method of forming the semiconductor structure at various fabrication stages according to aspects of the present disclosure in one or more embodiments.

Referring to FIG. 11A, in operation 31, a first gate electrode 304G is formed in a dielectric layer 302. In some embodiments, the dielectric layer 302 may be similar to the dielectric layer 102, and the first gate electrode 304G may be similar to the conductive layer 104 shown in FIGS. 2A and 4A. Further, the dielectric layer 302 may be formed over a semiconductor substrate. In some embodiments, a first source electrode 304S and a first drain electrode 304D are also formed in the dielectric layer 302. In some embodiments, the first gate electrode 304G, the first source electrode 304S and the first drain electrode 304D may be an Mn metal layer of an interconnect structure, and the dielectric layer 302 may be an Nth inter-metal dielectric (IMDn) layer. Operations for forming the first gate electrode 304G, the first source electrode 304S and the first drain electrode 304D are similar to those for forming similar elements described above; therefore, repeated descriptions are omitted for brevity. Further, another conductive layer may be formed in the dielectric layer 302 and serve as a metal layer such as a metal layer Mn. It should be noted that although the metal layer Mn is omitted from FIGS. 11A to 11K, those skilled in the art will realize the first metal layer M1 according to FIGS. 7A to 7I. Additionally, in some embodiments, the first gate electrode 304G serves as a buried gate electrode, and the first source electrode 304S and the first drain electrode 304D serve as a buried source electrode and a buried drain electrode, respectively.

Referring to FIG. 11A, in some embodiments, a buffer layer 306 may be formed over the dielectric layer 302, the first gate electrode 304G, the first source electrode 304S and the first drain electrode 304D. As mentioned above, the buffer layer 306 can be referred to as a stress layer. In some embodiments, a seed layer 308 may be formed over the buffer layer 306.

Still referring to FIG. 11A, in operation 32, a memory layer 310 is formed over the seed layer 308. The memory layer 310 may be similar to the ferroelectric layer 106 shown in FIGS. 2A and 4A; therefore, repeated descriptions are omitted for brevity. In some embodiments, the method 30 may be integrated with the method 10; thus, a SUT treatment 110 is performed on the memory layer (i.e., the ferroelectric layer) 310. Accordingly, a film quality of the formed ferroelectric layer 310 is improved.

Figure 11B:
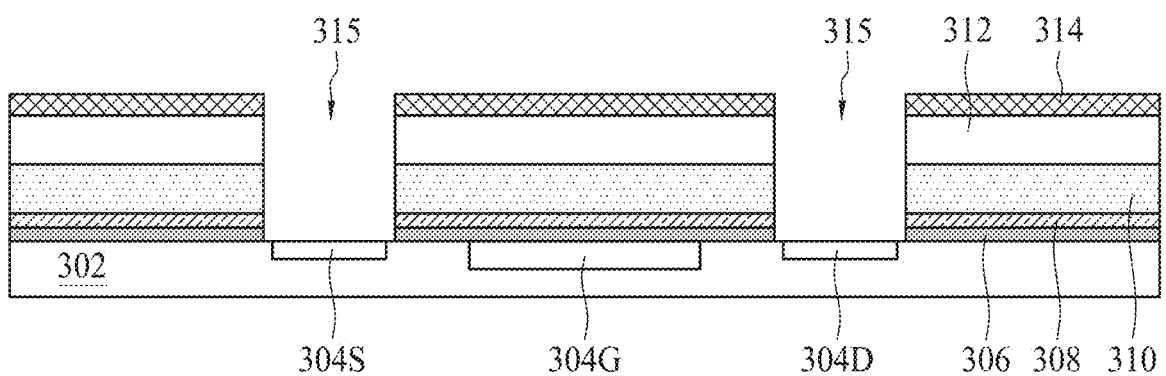

Referring to FIG. 11B, in some embodiments, a conductive layer 312 is formed over the ferroelectric layer 310. In some embodiments, an insulating layer 314 is formed over the conductive layer 312. In some embodiments, trenches 315 are formed in the above mentioned layers 314, 312, 310, 308 and 306. The trenches 315 are separated from each other. In some embodiments, the trenches 315 are aligned with the first source electrode 304S and the first drain electrode 304D, respectively. Further, the first source electrode 304S and the first drain electrode 304D are exposed through bottoms of the trenches 315.

Figure 11C:
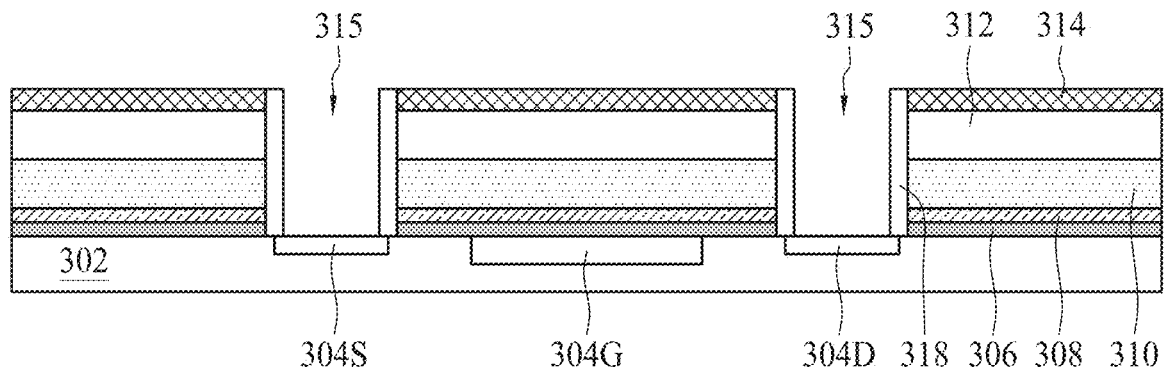

Referring to FIG. 11C, in some embodiments, spacers 318 are formed to cover the sidewalls of the trenches 315. Operations for forming the spacers 318 are similar to those described above; therefore, repeated descriptions are omitted for brevity. As shown in FIG. 11C, a top surface of the insulating layer 314 is exposed, and the first source electrode 304S and the first drain electrode 304D are exposed through the bottoms of the trenches 315.

Figure 11D:
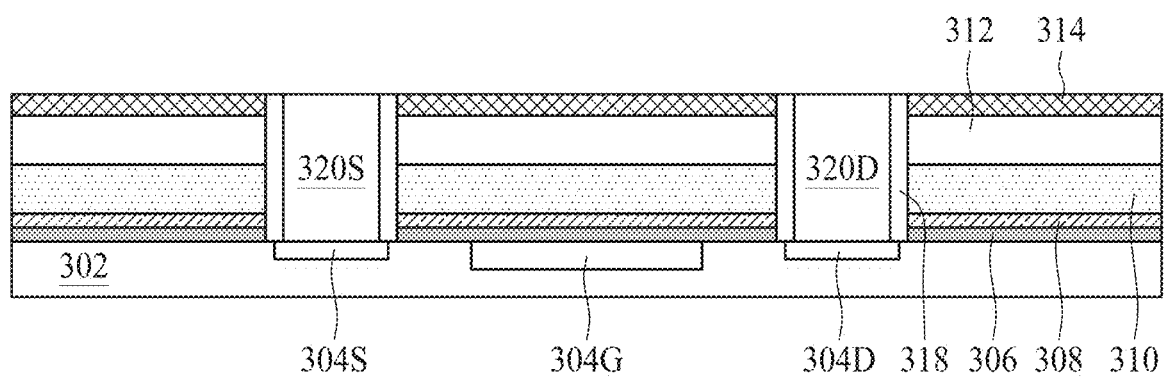

Referring to FIG. 11D, in some embodiments, a second source electrode 320S and a second drain electrode 320D are formed in the trenches 315. Operations for forming the second source electrode 320S and the second drain electrode 320D are similar to those described above; therefore, repeated descriptions are omitted for brevity. As shown in FIG. 11D, the second source electrode 320S is aligned with and in contact with the first source electrode 304S, and the second drain electrode 320D is aligned and in contact with the first drain electrode 304D. In some embodiments, the second source electrode 320S and the second drain electrode 320D may be referred to as a buried source interconnect metal and a buried drain interconnect metal, respectively.

Figure 11E:
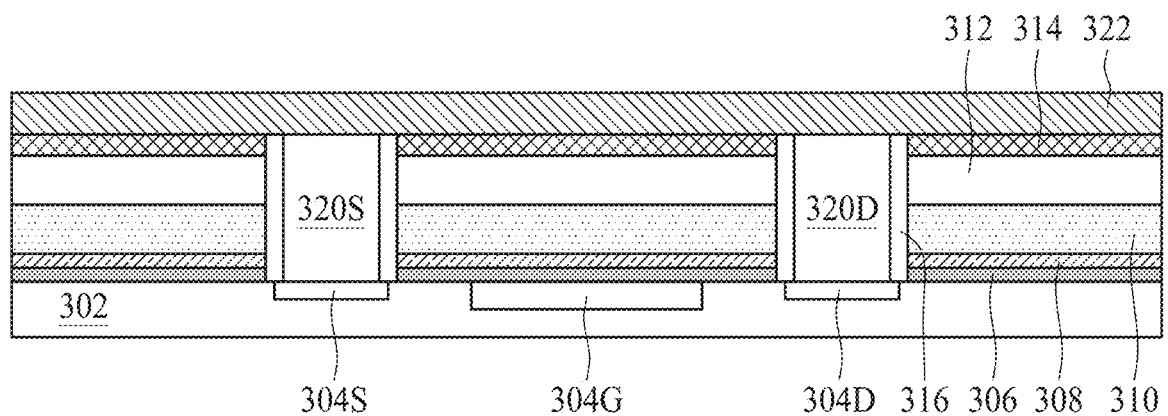

Referring to FIG. 11E, in some embodiments, in operation 33, a channel layer 322 is formed. The channel layer 322 may be similar to the metal oxide semiconductor layer 108 shown in FIGS. 2A and 4A; therefore, repeated descriptions are omitted for brevity. In some embodiments, the method 30 is integrated with the method 10; thus, an SUT treatment 120 is performed. The SUT treatment 120 is similar to that described above; therefore, repeated descriptions are omitted for brevity. Consequently, by performing the SUT treatment 120, a film quality of the channel layer 322 is improved.

Figure 11F:
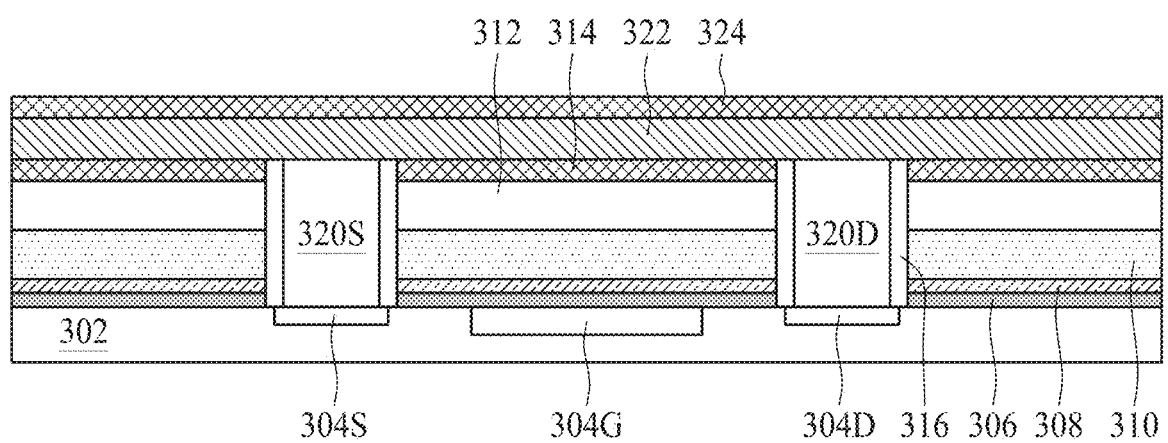

Referring to FIG. 11F, in some embodiments, a blocking layer 324 is formed over the channel layer 322. In some embodiments, the operation 34 may be performed prior to the forming of the blocking layer 324. In some alternative embodiments, the operation 34 may be performed after the forming of the blocking layer 324. In such embodiments, the SUT treatment still helps improve the film quality of the channel layer 322 by passing through the blocking layer 324.

Figure 11G:
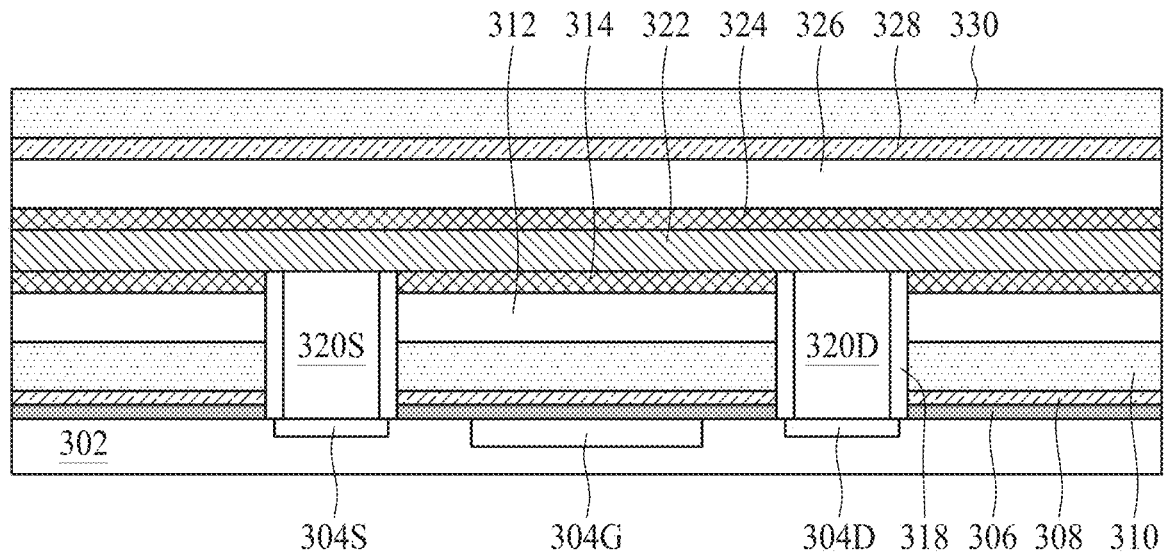

Referring to FIG. 11G, in some embodiments, a conductive layer 326 is formed over the blocking layer 324. The conductive layer 326 and the conductive layer 312 may include a same material; therefore, repeated descriptions are omitted for brevity. In some embodiments, a seed layer 328 is formed over the conductive layer 326. The seed layer 328 and the seed layer 308 may include a same material; therefore, repeated descriptions are omitted for brevity. In some embodiments, a ferroelectric layer 330 is formed over the seed layer 328. The ferroelectric layer 330 includes a material that is same as that of the ferroelectric layer 310; therefore, repeated descriptions are omitted for brevity. In some embodiments, an SUT treatment is performed on the ferroelectric layer 330 to improve the film quality of the ferroelectric layer 330. The performing of the SUT treatment is similar to those described above; therefore, repeated descriptions are omitted for brevity.

Figure 11H:
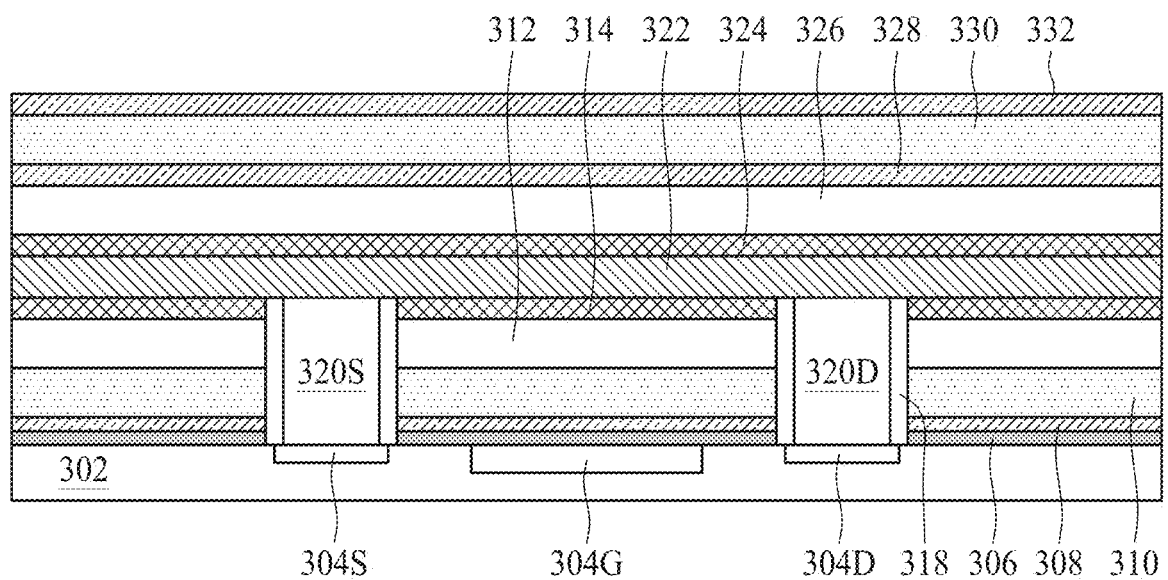

Referring to FIG. 11H, in some embodiments, another seed layer 332 is formed over the ferroelectric layer 330. The seed layer 332 and the seed layer 308 may include a same material; therefore, repeated descriptions are omitted for brevity. In some embodiments, the above-mentioned SUT treatment may be performed after the forming of the seed layer 332. In such embodiments, the film quality of the ferroelectric layer 330 is still improved by the SUT treatment passing through the seed layer 332.

Figure 11I:
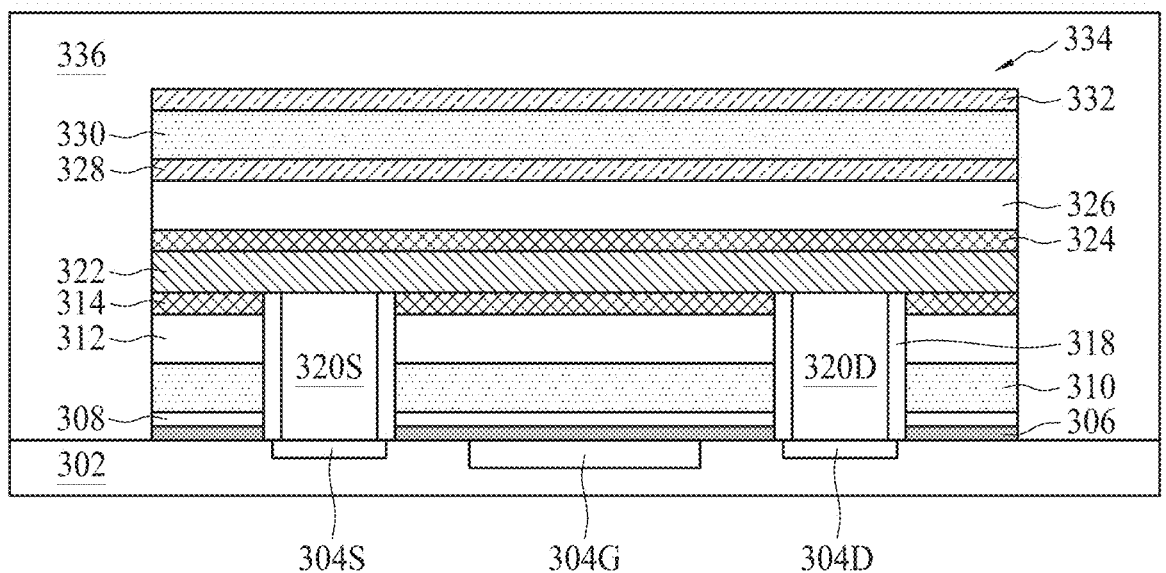

Referring to FIG. 11I, in some embodiments, the above-mentioned layers are patterned. Consequently, a multilayer structure 334 is obtained over the dielectric layer 302. In some embodiments, in operation 35, a dielectric layer 336 is formed over the multilayer structure 334. In some embodiments, a material used to form the dielectric layer 336 and a material used to form the dielectric layer 302 may be the same, but the disclosure is not limited thereto. Further, a thickness of the dielectric layer 336 is greater than a thickness (or a height) of the multilayer structure 334, such that the multilayer structure 334 is entirely embedded in the dielectric layer 336.

Figure 11J:
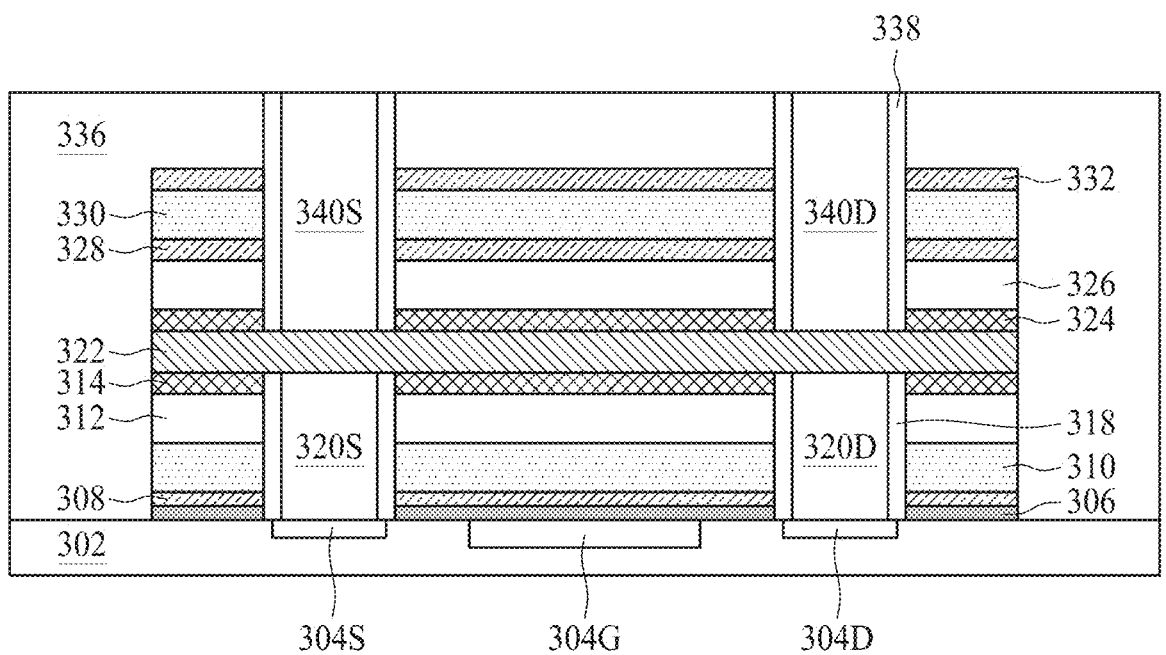

Referring to FIG. 11J, in some embodiments, a plurality of trenches (not shown) are formed in the dielectric layer 336 and the multilayer structure 334. After the forming of the trenches, spacers 338 may be formed over sidewalls of each trench. The forming of the trenches and the spacers 338 may be similar to the forming of similar elements described above; therefore, repeated descriptions are omitted for brevity. In some embodiments, a third source electrode 340S and a third drain electrode 340D are formed in the trenches. Further, a connecting structure may be also formed in the dielectric layer 336. The forming of the third source electrode 340S, the third drain electrode 340D and the connecting structure may be similar to the forming of similar elements described above; therefore, repeated descriptions are omitted for brevity. As shown in FIG. 11J, the third source electrode 340S is aligned with the second source electrode 320S, and the third drain electrode 340D is aligned with the second drain electrode 320D. In some embodiments, a bottom of the third source electrode 340S and a bottom of the third drain electrode 340D are in contact with the channel layer 322.

Figure 11K:
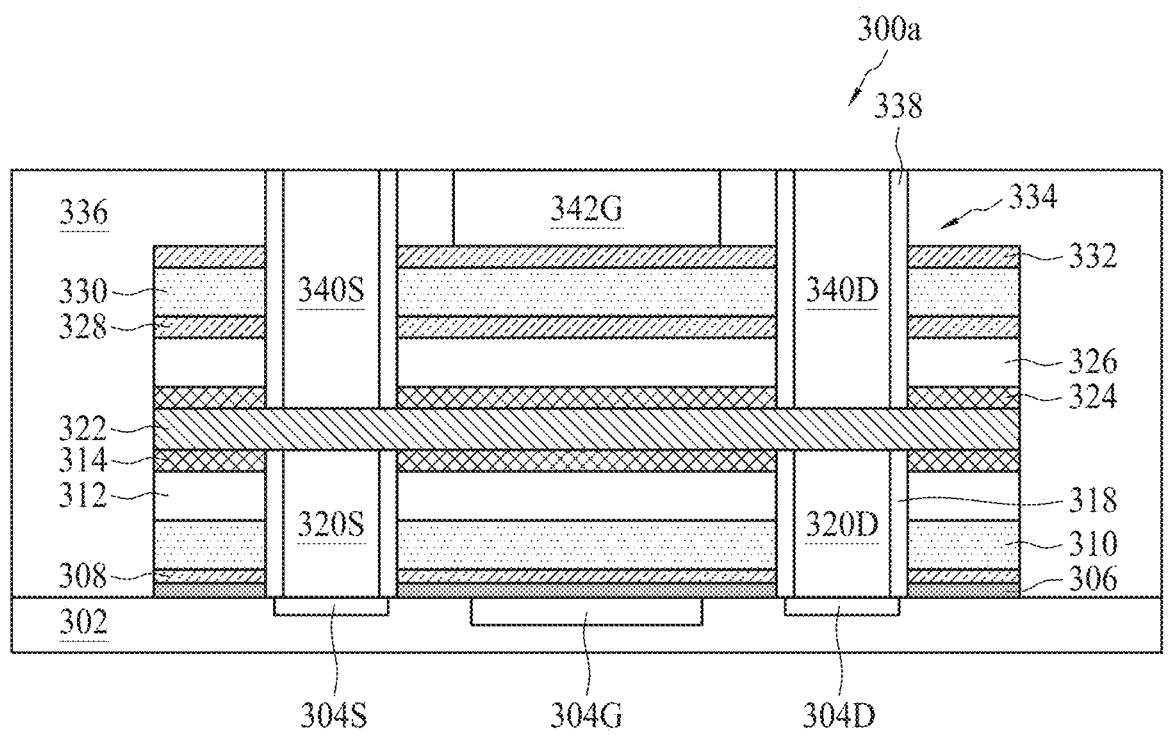

Referring to FIG. 11K, in some embodiments, a second gate electrode 342G is formed in the dielectric layer 336. The forming of the second gate electrode 342G may be similar to the forming of similar elements described above; therefore, repeated descriptions are omitted for brevity. As shown in FIG. 11K, the second gate electrode 342G is formed between the third source electrode 340S and the third drain electrode 340D, and is aligned with the first gate electrode 304G. Further, the second gate electrode 342G may be in contact with the seed layer 332. As mentioned above, the second gate electrode 342G, the third source electrode 340S and the third drain electrode 340D may include a same material, but the disclosure is not limiter thereto.

According to the method 30, which may be integrated with the method 10 or the method 20, a memory device 300a may be formed with the forming of the BEOL interconnect structure. Further, the SUT treatment, which uses the UV radiation and the anneal with the temperature less than 400° C., may help improve the film qualities of the ferroelectric layers 310 and 330 and the channel layer 322 with less thermal impact on the conductive layers and the first gate electrode 304G.

Accordingly, the methods 10, 20 and 30 may be used to form a double gate MFMIS 300a in a BEOL interconnect structure. In such embodiments, the conductive layers 312 and 326 may respectively serve as floating gate electrode.

Please refer to FIGS. 12A to 12J, which are schematic drawings illustrating the method of forming the semiconductor structure at various fabrication stages according to aspects of the present disclosure in one or more embodiments. Further, similar elements in FIGS. 11A to 11K and FIGS. 12A to 12J can include similar materials, and thus repeated descriptions of such details are omitted in the interest of brevity.

Figure 12A:
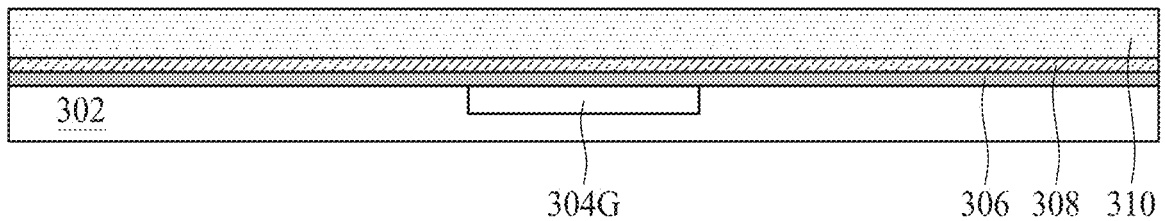
FIGS. 12A to 12J are schematic drawings illustrating the method of forming the semiconductor structure at various fabrication stages according to aspects of the present disclosure in one or more embodiments.

Referring to FIG. 12A, in operation 31, a first gate electrode 304G is formed in a dielectric layer 302. In some embodiments, the first gate electrode 304G, may be an Mn metal layer of an interconnect structure, and the dielectric layer 302 may be an Nth inter-metal dielectric (IMDn) layer. Operations for forming the first gate electrode 304G are similar to those described above; therefore, repeated descriptions are omitted for brevity. Further, another conductive layer may be formed in the dielectric layer 302 and serve as a metal layer such as a metal layer Mn. It should be noted that although the metal layer Mn is omitted from FIGS. 12A to 12J, those skilled in the art will realize the metal layer Mn according to FIGS. 7A to 7I. Additionally, in some embodiments, the first gate electrode 304G serves as a buried gate electrode.

Referring to FIG. 12A, in some embodiments, a buffer layer 306 may be formed over the dielectric layer 302 and the first gate electrode 304G. As mentioned above, the buffer layer 306 can be referred to as a stress layer. In some embodiments, a seed layer 308 may be formed over the buffer layer 306.

Still referring to FIG. 12A, in operation 32, a memory layer 310 is formed over the seed layer 308. The memory layer 310 may be similar to the ferroelectric layer 106 shown in FIGS. 2A and 4A; therefore, repeated descriptions are omitted for brevity. In some embodiments, the method 30 may be integrated with the method 10; thus, an SUT treatment 110 is performed on the memory layer (i.e., the ferroelectric layer) 310 after the forming of the ferroelectric layer 310. Accordingly, a film quality of the formed ferroelectric layer 310 is improved.

Figure 12B:
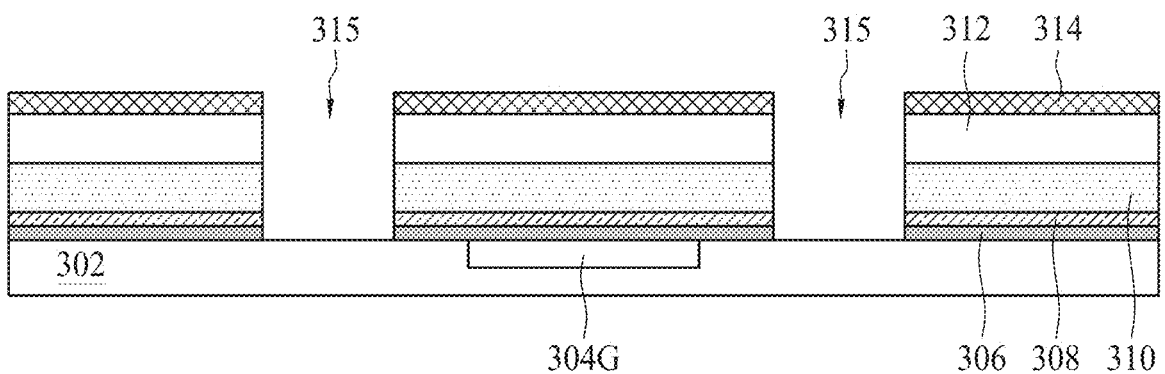

Referring to FIG. 12B, in some embodiments, a conductive layer 312 is formed over the ferroelectric layer 310. In some embodiments, an insulating layer 314 is formed over the conductive layer 312. In some embodiments, trenches 315 are formed in the insulating layer 314, the conductive layer 312, the ferroelectric layer 310, the seed layer 308, and the blocking layer 306. As shown in FIG. 12B, a top surface of the insulating layer 314 is exposed, and the dielectric layer 302 is exposed through the bottoms of the trenches 315.

Figure 12C:
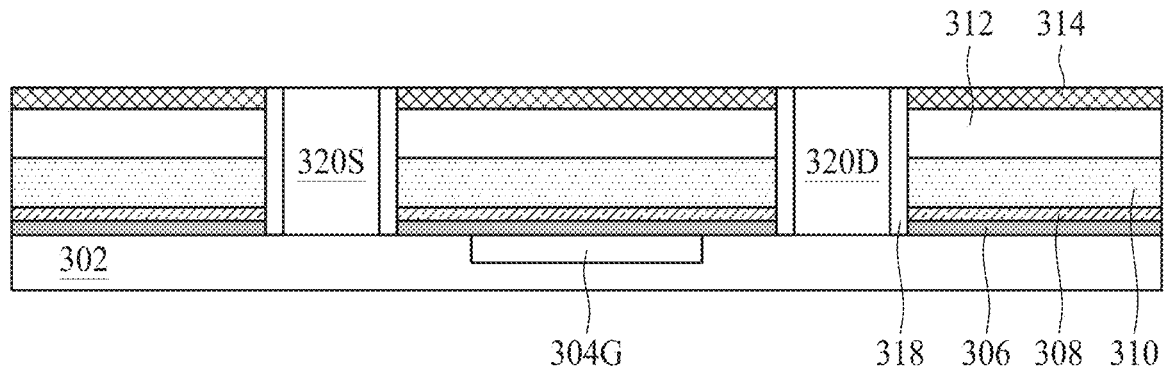

Referring to FIG. 12C, in some embodiments, spacers 318 are formed to cover sidewalls of the trenches 315. Operations for forming the spacers 318 are similar to those described above; therefore, repeated descriptions are omitted for brevity.

Referring to FIG. 12C, in some embodiments, a first source electrode 320S and a first drain electrode 320D are formed in the trenches 315. Operations for forming the first source electrode 320S and the first drain electrode 320D are similar to those described above; therefore, repeated descriptions are omitted for brevity. In some embodiments, the first source electrode 320S and the first drain electrode 320D may be referred to as a buried source interconnect metal and a buried drain interconnect metal, respectively.

Figure 12D:
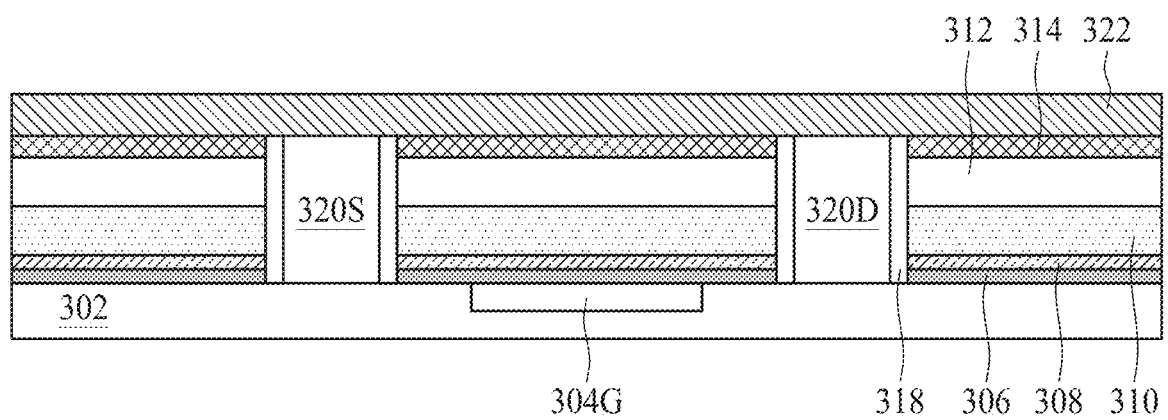

Referring to FIG. 12D, in some embodiments, in operation 33, a channel layer 322 is formed. The channel layer 322 may be similar to the metal oxide semiconductor layer 108 shown in FIGS. 2A and 4A; therefore, repeated descriptions are omitted for brevity. In some embodiments, the method 30 is integrated with the method 20; thus, an SUT treatment 120 is performed. For example, in operation 34, an SUT treatment is performed on the channel layer 322. The SUT treatment is similar to those described above; therefore, repeated descriptions are omitted for brevity. Consequently, by performing the SUT treatment, a film quality of the channel layer 322 is improved.

Figure 12E:
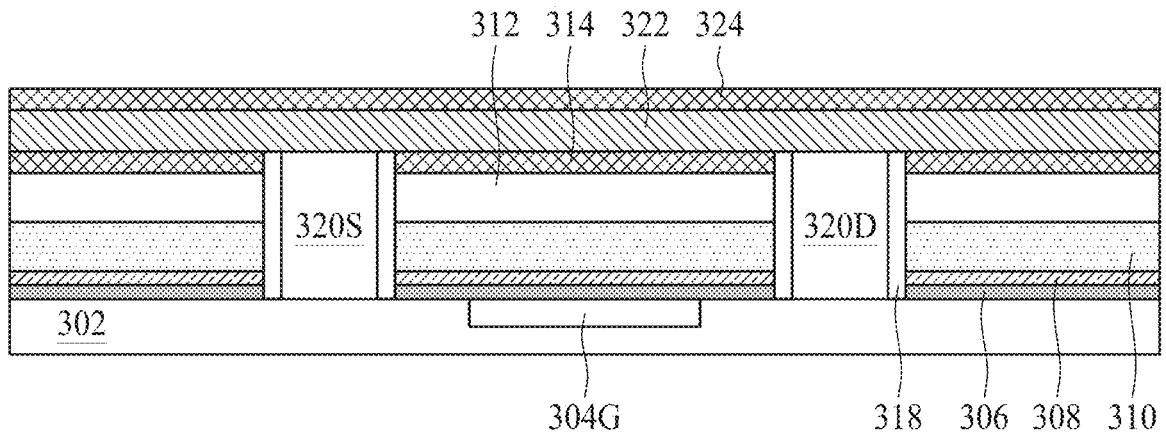

Referring to FIG. 12E, in some embodiments, a blocking layer 324 is formed over the channel layer 322. In some embodiments, the operation 34 may be performed after the forming of the blocking layer 324. In such embodiments, the SUT treatment still helps improve the film quality of the channel layer 322 by passing through the blocking layer 324.

Figure 12F:
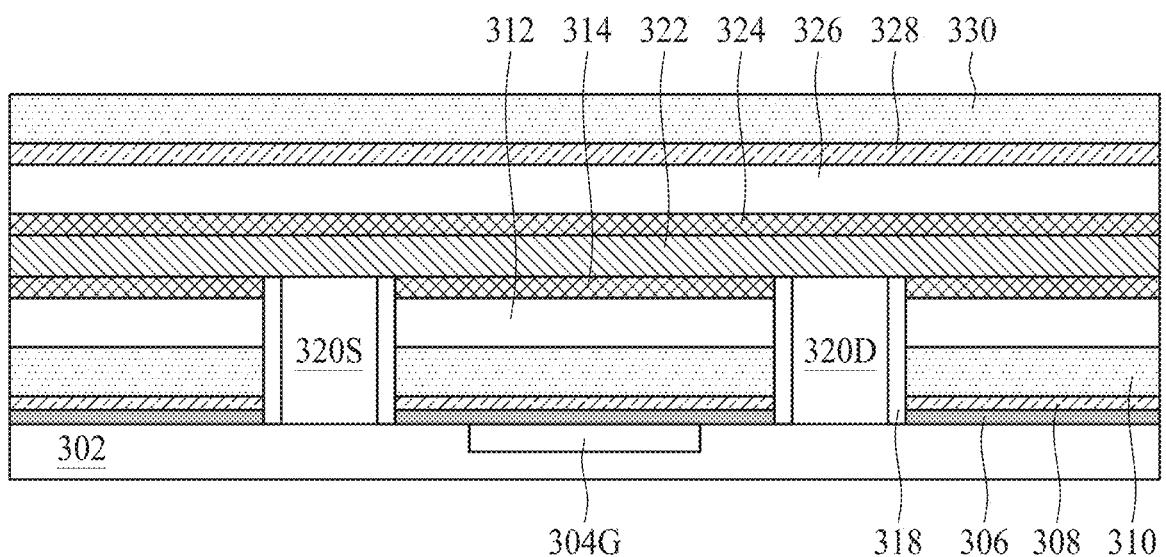

Referring to FIG. 12F, in some embodiments, a conductive layer 326 is formed over the blocking layer 324. The conductive layer 326 and the conductive layer 312 may include a same material; therefore, repeated descriptions are omitted for brevity. In some embodiments, a seed layer 328 is formed over the conductive layer 326. The seed layer 328 and the seed layer 308 may include a same material; therefore, repeated descriptions are omitted for brevity. In some embodiments, a ferroelectric layer 330 is formed over the seed layer 328. The ferroelectric layer 330 includes a material that is same as that of the ferroelectric layer 310; therefore, repeated descriptions are omitted for brevity. In some embodiments, an SUT treatment is performed on the ferroelectric layer 330 to improve the film quality of the ferroelectric layer 330. The performing of the SUT treatment is similar to those described above; therefore, repeated descriptions are omitted for brevity.

Figure 12G:
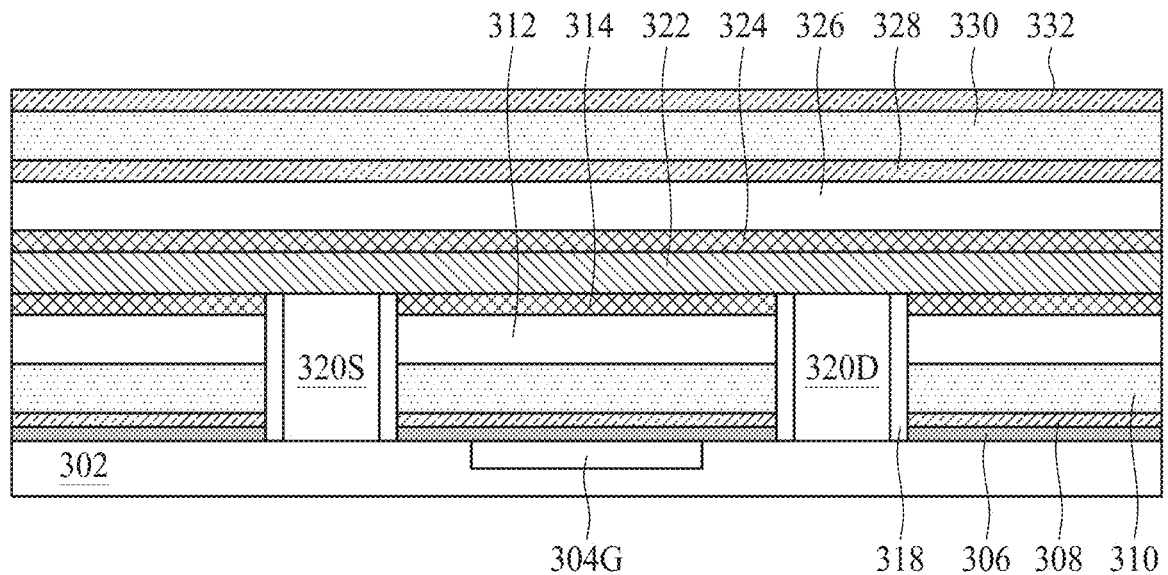

Referring to FIG. 12G, in some embodiments, a seed layer 332 is formed over the ferroelectric layer 330. The seed layer 332 and the seed layer 308 may include a same material; therefore, repeated descriptions are omitted for brevity. In some embodiments, the above-mentioned SUT treatment may be performed after the forming of the seed layer 332. In such embodiments, the film quality of the ferroelectric layer 330 is still improved by the SUT treatment by passing through the seed layer 332.

Figure 12H:
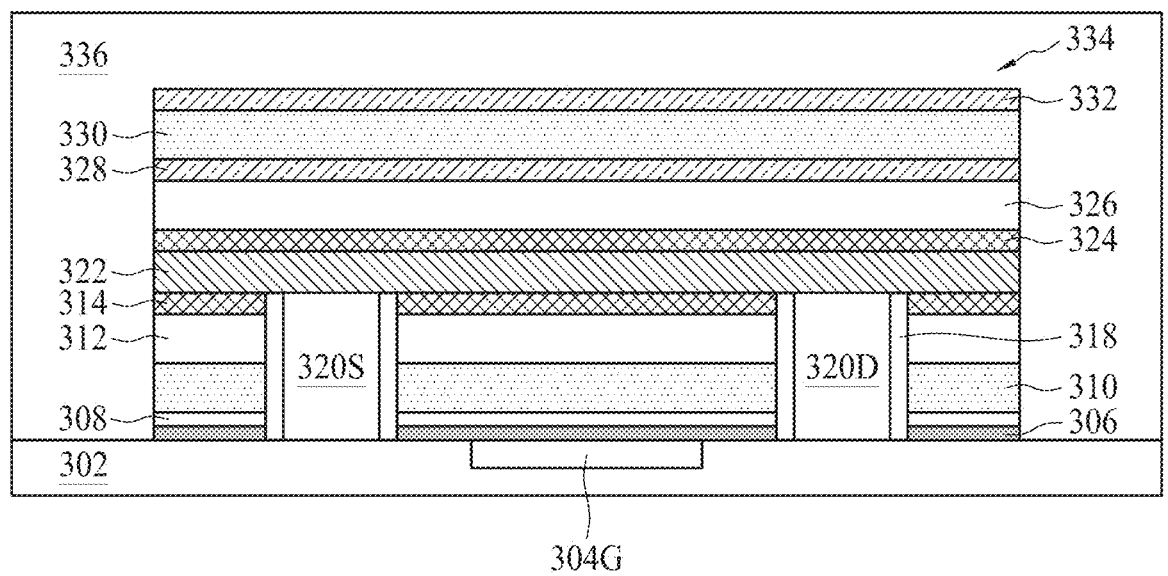

Referring to FIG. 12H, in some embodiments, the above-mentioned layers are patterned. Consequently, a multilayer structure 334 is obtained over the dielectric layer 302. In some embodiments, in operation 35, a dielectric layer 336 is formed over the multilayer structure 334. In some embodiments, a material used to form the dielectric layer 336 and a material used to form the dielectric layer 302 may be the same, but the disclosure is not limited thereto. Further, a thickness of the dielectric layer 336 is greater than a thickness (or a height) of the multilayer structure 334, such that the multilayer structure 334 is entirely embedded in the dielectric layer 336.

Figure 12I:
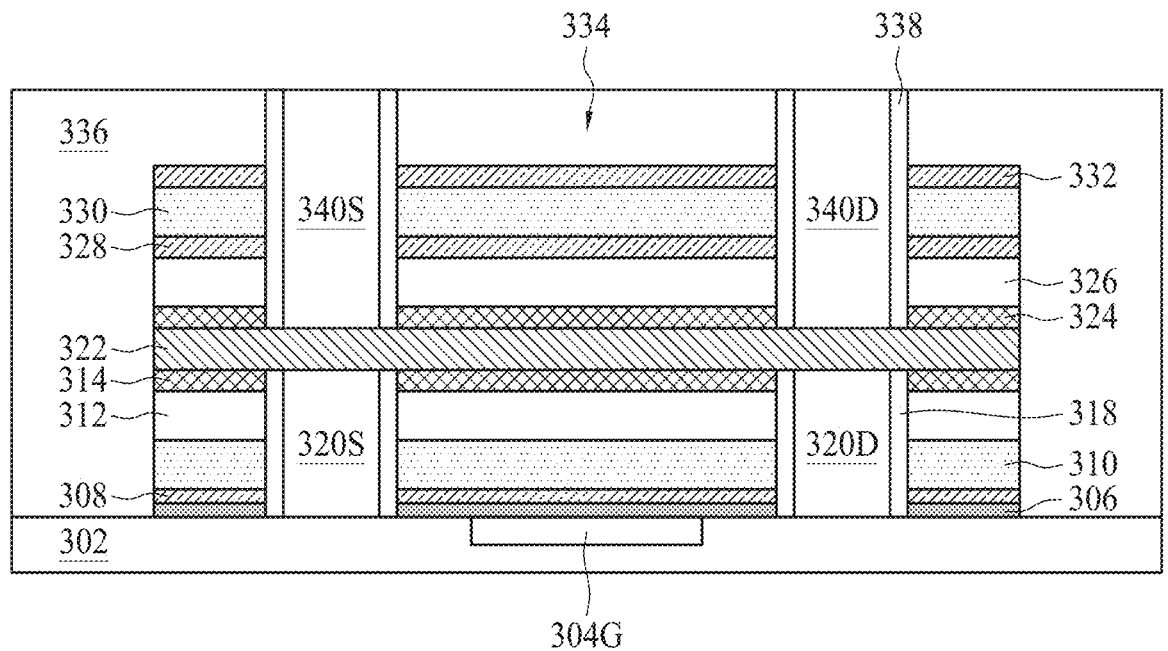

Referring to FIG. 12I, in some embodiments, a plurality of trenches (not shown) are formed in the dielectric layer 336 and the multilayer structure 334. After the forming of the trenches, spacers 338 may be formed over sidewalls of each trench. The forming of the trenches and the spacers 338 may be similar to the forming of similar elements described above; therefore, repeated descriptions are omitted for brevity. In some embodiments, a second source electrode 340S and a second drain electrode 340D are formed in the trenches. Further, a connecting structure may be also formed in the dielectric layer 336. The forming of the second source electrode 340S, the second drain electrode 340D and the connecting structure may be similar to the forming of similar elements described above; therefore, repeated descriptions are omitted for brevity. As shown in FIG. 12I, a bottom of the second source electrode 340S and a bottom of the second drain electrode 340D are in contact with a top surface of the channel layer 322.

Figure 12J:
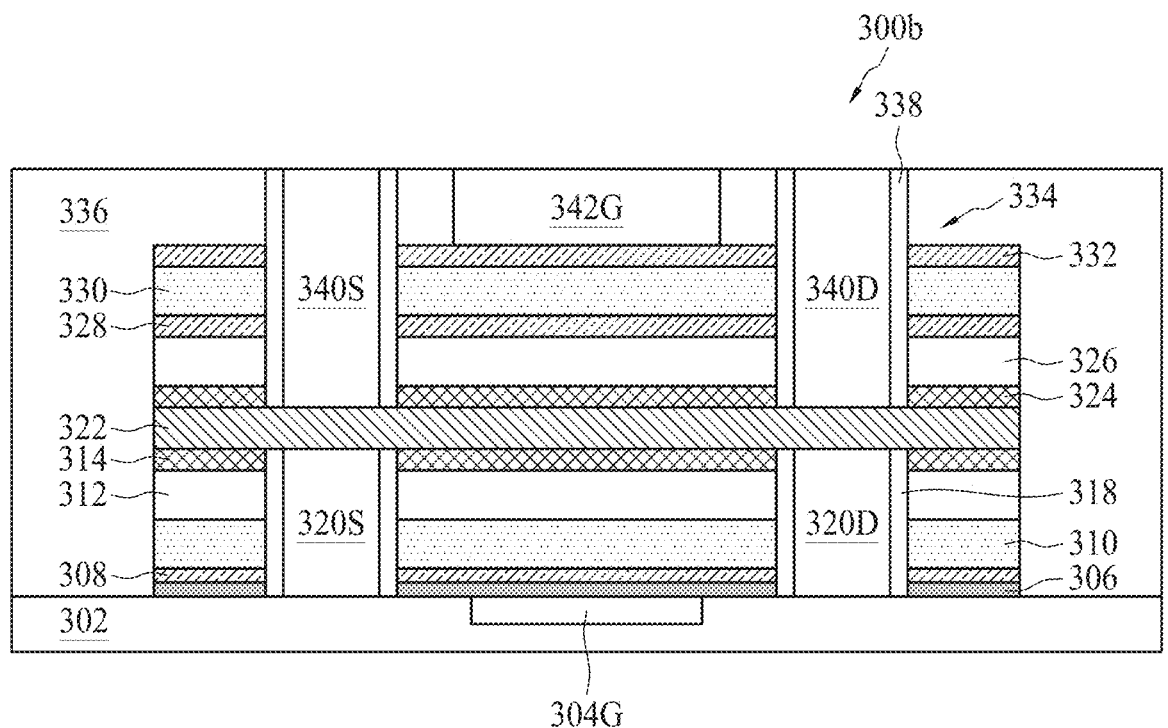

Referring to FIG. 12J, in some embodiments, a second gate electrode 342G is formed in the dielectric layer 336. The forming of the second gate electrode 342G may be similar to the forming of similar elements described above; therefore, repeated descriptions are omitted for brevity. As shown in FIG. 12J, the second gate electrode 342G is formed between the second source electrode 340S and the second drain electrode 340D, and is aligned with the first gate electrode 304G. Further, the second gate electrode 342G may be in contact with the seed layer 332. As mentioned above, the second gate electrode 342G, the second source electrode 340S and the second drain electrode 340D may include a same material, but the disclosure is not limited thereto.

According to the method 30, which may be integrated with the method 10 or the method 20, a memory device 300b may be formed with the forming of the BEOL interconnect structure. Further, the SUT treatment, which uses the UV radiation and the anneal with the temperature less than 400° C., may help improve the film qualities of the ferroelectric layers 310 and 330 and the channel layer 322 with less thermal impact on the conductive layers and the first gate electrode 304G.

Accordingly, the methods 10, 20 and 30 may be used to form a double gate MFMIS 300b in a BEOL interconnect structure. In such embodiments, the conductive layers 312 and 326 may respectively serve as floating gate electrodes.

In summary, the method uses a simultaneous ultraviolet and thermal (SUT) treatment performed on the ferroelectric material and the metal oxide semiconductor material. As mentioned above, the SUT treatment may be performed directly after the forming of the ferroelectric material and/or directly after the forming of the metal oxide semiconductor material. The SUT treatment may be performed on other materials overlying the ferroelectric material and the metal oxide semiconductor material. In some embodiments, the SUT treatment may be performed prior to the forming of materials having reflection coefficient greater than those of the ferroelectric material, the metal oxide semiconductor material and the dielectric material. For example, the SUT treatment may be performed prior to the forming of metal. The SUT treatment may improve qualities of the ferroelectric material and the metal oxide semiconductor material at a temperature less than approximately 400° C., which is lower than the thermal budget of the BEOL interconnect structure.

According to one embodiment of the present disclosure, a method of forming a semiconductor structure is disclosed. The method includes following operations. A first gate electrode is formed in a dielectric layer. A memory layer is formed over the first gate electrode. A channel layer is formed over the memory layer. A first SUT treatment is performed. A second dielectric layer is formed over the memory layer and the channel layer. A source electrode and a drain electrode are formed in the second dielectric layer. A temperature of the first SUT treatment is less than approximately 400° C.

According to one embodiment of the present disclosure, a method for forming a semiconductor structure is provided. The method includes following operations. A substrate is received. The substrate includes a first dielectric layer and a conducive layer formed in the first dielectric layer. A ferroelectric layer is formed over the first dielectric layer and the conductive layer. A metal oxide semiconductor layer is formed over the ferroelectric layer. An SUT treatment is performed. A temperature of the SUT treatment is less than approximately 400° C.

According to one embodiment of the present disclosure, a semiconductor structure is provided. The semiconductor structure includes a first dielectric layer, a conductive layer and a gate electrode disposed in the first dielectric layer, a ferroelectric layer disposed over the gate electrode, a channel layer disposed over the ferroelectric layer, a second dielectric layer over the first dielectric layer, a source electrode and a drain electrode disposed in the second dielectric layer, and a connecting structure disposed in the second dielectric layer. The connecting structure is separated from the source electrode and the drain electrode. The ferroelectric layer has an orthorhombic crystal phase.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
    forming a first gate electrode in a first dielectric layer;
    forming a memory layer over the first gate electrode;
    forming a channel layer over the memory layer;
    performing a first simultaneous ultraviolet and thermal (SUT) treatment;
    forming a second dielectric layer over the memory layer and the channel layer; and
    forming a source electrode and a drain electrode in the second dielectric layer, wherein a temperature of the first SUT treatment is less than approximately 400° C.

2. The method of claim 1, wherein the first SUT treatment is performed on the memory layer prior to the forming of the channel layer.

3. The method of claim 2, further comprising performing a second SUT treatment on the channel layer after the forming of the channel layer.

4. The method of claim 3, wherein a temperature of the second SUT treatment and the temperature of the first SUT treatment are the same.

5. The method of claim 1, wherein first SUT treatment is performed on the memory layer and the channel layer after the forming of the channel layer.

6. The method of claim 1, wherein the first SUT treatment is performed on the memory layer and the channel layer after the forming of the second dielectric layer.

7. The method of claim 1, wherein the temperature of the first SUT treatment is between approximately 100° C. and approximately 400° C.

8. The method of claim 1, wherein a duration of the first SUT treatment is less than approximately 1 hour.

9. The method of claim 1, further comprising forming a second gate electrode in the second dielectric layer.

10. A method of forming a semiconductor structure, comprising:
    forming a gate electrode in a first dielectric layer;
    forming a memory layer over the gate electrode;

performing a first simultaneous ultraviolet and thermal (SUT) treatment on the memory layer;

forming a channel layer over the memory layer after the first SUT treatment; and forming a second dielectric layer over the memory layer and the channel layer, wherein a temperature of the first SUT treatment is less than approximately 400° C.

11. The method of claim 10, further comprising performing a second SUT treatment on the channel layer after the forming of the channel layer.

12. The method of claim 11, wherein a temperature of the second SUT treatment and the temperature of the first SUT treatment are the same.

13. The method of claim 10, further comprising forming a source electrode and a drain electrode in the second dielectric layer.

14. A method of forming a semiconductor structure, comprising:

forming a first gate electrode in a first dielectric layer;

forming a memory layer over the first gate electrode;

forming a channel layer over the memory layer;

performing a simultaneous ultraviolet and thermal (SUT) treatment on the memory layer and the channel layer;

forming a second dielectric layer over the memory layer and the channel layer; and forming a source electrode and a drain electrode in the second dielectric layer, wherein a temperature of the SUT treatment is less than approximately 400° C.

15. The method of claim 14, wherein the SUT treatment is performed after the forming of the channel layer.

16. The method of claim 14, wherein the SUT treatment is performed after the forming of the second dielectric layer.

17. The method of claim 16, further comprising patterning the memory layer and the channel layer prior to the forming of the second dielectric layer.

18. The method of claim 16, further comprising forming a second gate electrode in the second dielectric layer.

19. The method of claim 18, wherein the second gate electrode is separated from the source electrode and the drain electrode by the second dielectric layer.

20. The method of claim 18, wherein the second gate electrode is separated from the source electrode and the drain electrode by spacers.

* * * * *